(12) United States Patent
Piechocinski

(10) Patent No.: US 11,197,103 B2
(45) Date of Patent: Dec. 7, 2021

(54) MEMS DEVICES AND PROCESSES

(71) Applicant: Cirrus Logic International Semiconductor Ltd., Edinburgh (GB)

(72) Inventor: Marek Sebastian Piechocinski, Edinburgh (GB)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 16/606,932

(22) PCT Filed: Apr. 17, 2018

(86) PCT No.: PCT/GB2018/050998
§ 371 (c)(1),
(2) Date: Oct. 21, 2019

(87) PCT Pub. No.: WO2018/197838
PCT Pub. Date: Nov. 1, 2018

(65) Prior Publication Data
US 2020/0137501 A1  Apr. 30, 2020

Related U.S. Application Data

(60) Provisional application No. 62/491,491, filed on Apr. 28, 2017.

(30) Foreign Application Priority Data

Jun. 5, 2017  (GB) ..................... 1708905

(51) Int. Cl.
*H04R 19/04* (2006.01)
*H04R 1/08* (2006.01)
(Continued)

(52) U.S. Cl.
CPC ............. *H04R 19/04* (2013.01); *B01D 46/10* (2013.01); *B81B 7/0058* (2013.01);
(Continued)

(58) Field of Classification Search
CPC .. H04R 19/04; H04R 1/086; H04R 2201/003; H04R 31/00; B81B 2201/0257;
(Continued)

(56) References Cited

U.S. PATENT DOCUMENTS 5,452,268 A * 9/1995 Bernstein ............. H04R 19/005
381/174
6,535,460 B2   3/2003 Loeppert et al.
(Continued)

FOREIGN PATENT DOCUMENTS

CN  103347808 A  10/2013
CN  103922269 A  7/2014
(Continued)

OTHER PUBLICATIONS

International Search Report and Written Opinion of the International Searching Authority, International Application No. PCT/GB2018/050998, dated Jun. 21, 2018.
(Continued)

*Primary Examiner* — Brian Ensey
(74) *Attorney, Agent, or Firm* — Jackson Walker L.L.P.

(57) ABSTRACT

MEMS devices comprise a filter configured and arranged to inhibit the entry of particles into at least a region of the interior of the substrate cavity from a region underlying the substrate.

21 Claims, 17 Drawing Sheets

(51) Int. Cl.
- *B01D 46/10* (2006.01)
- *B81B 7/00* (2006.01)
- *B81C 1/00* (2006.01)
- *H04R 19/00* (2006.01)

(52) U.S. Cl.
CPC ........ *B81B 7/0064* (2013.01); *B81C 1/00333* (2013.01); *H04R 1/086* (2013.01); *H04R 19/005* (2013.01); *B01D 2279/45* (2013.01); *B81B 2201/0257* (2013.01); *B81B 2203/0127* (2013.01); *B81B 2203/0315* (2013.01); *B81B 2207/012* (2013.01); *B81C 2201/0105* (2013.01); *B81C 2201/0132* (2013.01); *H04R 2201/003* (2013.01)

(58) Field of Classification Search
CPC .... B81B 2203/0127; B81B 2203/0315; B81C 1/00333; B01D 46/10
See application file for complete search history.

(56) References Cited

U.S. PATENT DOCUMENTS

| | | | | |
|---|---|---|---|---|
| 8,447,057 B2* | 5/2013 | Goida | ...................... | H04R 1/02 381/361 |
| 9,584,889 B2* | 2/2017 | Escher-Poeppel | ..... | H04R 1/021 |
| 10,167,188 B2* | 1/2019 | Agashe | ................. | B81B 7/0038 |
| 2014/0299949 A1 | 10/2014 | Conti et al. | | |
| 2015/0041930 A1* | 2/2015 | Kim | ...................... | H04R 31/00 257/416 |
| 2015/0060955 A1 | 3/2015 | Chen | | |
| 2015/0061048 A1 | 3/2015 | Escher-Opeppel et al. | | |
| 2015/0086050 A1 | 3/2015 | Feyh | | |

FOREIGN PATENT DOCUMENTS

| | | |
|---|---|---|
| CN | 104418291 A | 3/2015 |
| CN | 105939506 A | 9/2016 |
| EP | 2252077 A1 | 11/2010 |
| EP | 3065416 A1 | 9/2016 |
| WO | 2007112743 A1 | 10/2007 |
| WO | 2013097135 A1 | 7/2013 |
| WO | 2017027242 A1 | 2/2017 |

OTHER PUBLICATIONS

Combined Search and Examination Report under Sections 17 and 18(3), UKIPO, Application No. GB1708347.8, dated Dec. 6, 2017.
Patent Application Search Report, Taiwan Intellectual Property Office, Application No. 107113569, dated Mar. 4, 2019.
Rejection Decision, Taiwan Intellectual Property Office, Application No. 107113569.
Examination Report, Taiwan Intellectual Property Office, TW Application No. 107113569, dated Jun. 22, 2020.
Examination Report under Section 18(3), UKIPO, Application No. GB1708905.3, dated Jul. 8, 2020.
Examination Report under Section 18(3), UKIPO, Application No. GB1708905.3, dated Nov. 28, 2019.

* cited by examiner

MEMS DEVICES AND PROCESSES

The present application is a 371 of International Patent Application No. PCT/GB2018/050998, filed Apr. 17, 2018, which claims priority to U.S. Provisional Patent Application Ser. No. 62/491491, filed Apr. 28, 2017, and United Kingdom Patent Application Serial No. 1708905.3, filed Jun. 5, 2017, each of which is incorporated by reference herein in its entirety.

TECHNICAL FIELD

This application relates to micro-electro-mechanical system (MEMS) devices and processes, and in particular to a MEMS device and process relating to a transducer, for example a capacitive microphone.

BACKGROUND INFORMATION

MEMS devices are becoming increasingly popular. MEMS transducers and especially MEMS capacitive microphones, are increasingly being used in portable electronic devices such as mobile telephone and portable computing devices.

Microphone devices formed using MEMS fabrication processes typically comprise one or more moveable membranes and a static backplate, with a respective electrode deposited on the membrane(s) and backplate, wherein one electrode is used for read-out/drive and the other is used for biasing. A substrate supports at least the membrane(s) and typically the backplate also. In the case of MEMS pressure sensors and microphones the read out is usually accomplished by measuring the capacitance between the membrane and backplate electrodes. In the case of transducers, the device is driven, i.e. biased, by a potential difference provided across the membrane and backplate electrodes.

FIG. 1 shows a known capacitive MEMS microphone device 10. The capacitive microphone device 10 comprises a membrane layer 1 which forms a flexible membrane which is free to move in response to pressure differences generated by sound waves. A first electrode 3 is mechanically coupled to the flexible membrane, and together they form a first capacitive plate of the capacitive microphone device. A second electrode 2 is mechanically coupled to a generally rigid structural layer or backplate 4, which together form a second capacitive plate of the capacitive microphone device.

In use, in response to a sound wave corresponding to a pressure wave incident on a MEMS microphone transducer, the membrane is deformed slightly from its equilibrium position. The distance between the lower electrode 3 and the upper electrode 2 is correspondingly altered, giving rise to a change in capacitance between the two electrodes that is subsequently detected by electronic circuitry (not shown).

The capacitive microphone is formed on a substrate 101, for example a silicon substrate, which may have upper and lower oxide layers 103, 105 formed thereon. A cavity or through-hole 8 in the substrate and in any overlying layers (hereinafter also referred to as a substrate cavity) is provided below the membrane. The substrate cavity 8 connects to a first cavity 9 located directly below the membrane. These cavities 8 and 9 may collectively provide an acoustic volume thus allowing movement of the membrane in response to an acoustic stimulus. Interposed between the first and second electrodes 2 and 3 is a second cavity 10. A plurality of bleed holes 11 connect the first cavity 9 and the second cavity 10.

A plurality of acoustic holes 12 are arranged in the back-plate 4 so as to allow free movement of air molecules through the back plate, such that the second cavity 10 forms part of an acoustic volume with a space on the other side of the back-plate. The membrane 1 is thus supported between two volumes, one volume comprising cavities 9 and substrate cavity 8 and another volume comprising cavity 10 and any space above the back-plate. These volumes are sized such that the membrane can move in response to the sound waves entering via one of these volumes. Typically the volume through which incident sound waves reach the membrane is termed the "front volume" with the other volume, which may be substantially sealed, being referred to as a "back volume".

To provide protection a MEMS transducer will typically be contained within a package. The package effectively encloses the MEMS transducer and can provide environmental protection and may also provide shielding for electromagnetic interference (EMI), electrostatic discharge (ESD) or the like. The package also provides at least one external connection for outputting the electrical signal to downstream circuitry. For microphones, pressure sensors and the like the package will typically have a port hole to allow transmission of acoustic pressure waves to/from the transducer within the package.

As a consequence of the need for a port hole within the package, environmental contamination in the form of e.g. solid particles within the package will still arise. It will be appreciated that the presence of solid particles within the cavities of a MEMS transducer, in particular in the air gap between the two electrodes, may have a detrimental effect on the performance and/or functionality of the device. For example, in the case of a MEMS microphone transducer, solid particles may enter the transducer package through the acoustic port and may ultimately contaminate the transducer device via the substrate cavity. The occurrence of particles within a MEMS transducer, and particularly within the acoustic cavities of a microphone transducer, may result in a number of problems including the occurrence of electrical shorts, mechanical blockage, i.e. occlusion, and corrosion. Thus, the performance of the MEMS may degrade over time as a result of particle contaminants and critical failure of the device is also possible if the movement of the membrane is inhibited by contaminant particles.

It will also be appreciated that water will tend to build up on the surfaces of the MEMS transducer. The presence of water within the MEMS cavities may also potentially affect transducer performance and/or functionality, e.g. by exacerbating corrosion and sensitivity drift.

It is known to provide a MEMS transducer with an environmental barrier, e.g. a particle filter for preventing, or at least inhibiting, particles from reaching the transducer. The environmental barrier may also prevent liquid water— from reaching the transducer. Such a filter/barrier is typically provided between an upper surface of the substrate and the membrane. However, this arrangement may pose a risk that the membrane will make contact with, and potentially become stuck to, the barrier/filter.

Examples described herein are concerned with MEMS transducers which incorporate an environmental filter in order to alleviate the problems associated with solid particle contamination and/or the ingress of water—into the cavities of the transducer. Examples described herein are particularly, but not exclusively applicable to MEMS microphone transducers.

SUMMARY OF EMBODIMENTS

According to an example embodiment of a first aspect there is provided a MEMS transducer comprising:

a substrate having a cavity which extends through the substrate;

a membrane which overlies the cavity;

a filter configured and arranged to inhibit the entry of particles into at least a region of the interior of the substrate cavity from a region underlying the substrate.

The substrate cavity may be considered to define an acoustic path from a first opening in a first side of the substrate to a second opening in a second side of the substrate, wherein the membrane is supported relative to, or "above", the second side of the substrate. The filter, which may be considered to form an integrated filter of the MEMS transducer, provides environmental protection to at least a part of the inside of the cavity. Thus, the filter may be positioned within the substrate cavity and/or maybe provided in a plane below the substrate cavity. The filter may comprise one or more filter layers. The filter may be considered to be provided in a plane below the upper surface of the substrate, preferably at or near the plane of the lower surface of the substrate. The filter may define a barrier between a first region, the first region comprising at least a part of the substrate cavity, and a second region, the second region comprising a region beneath the substrate cavity.

The precise method of fabrication of the MEMS transducer will typically determine the final location of the integrated filter. The filter, or barrier, may be understood to comprise at least one layer of material which is configured to inhibit one or more contaminants from passing through the filter. Thus, the layer of material may be a perforated layer of material which is configured to allow acoustic pressure waves to pass through the filter and inhibit, or substantially prevent, particles having a size in the range 5 um-15 um from passing through the filter. The filter may comprise more than one layer, wherein each layer may be configured to inhibit particles of a different size range. According to an example in which the filter comprising a first layer and a second filter layer, a plurality of holes formed in the first filter layer are offset with respect to a plurality of holes provided in the second filter layer. According to such arrangements, it is possible to provide two or more filtering levels, wherein a first filter layer provides filtering of smaller particles than a second filter layer.

According to an example of a second aspect there is provided a MEMS transducer comprising:

a substrate having a cavity which extends through the substrate from a first opening in a first side of the substrate to a second opening in a second side of the substrate; a membrane which is supported relative to the second side of substrate and overlies the cavity;

a filter provided within the substrate cavity comprising at least one filter layer at/across the first opening of the substrate cavity.

According to an example of a third aspect there is provided a MEMS transducer comprising a flexible membrane supported relative to a substrate cavity, the transducer having an integrated filter for providing environmental protection to at least a region of the substrate cavity.

It will be appreciated that in the context of the present disclosure, references to particles should be understood to mean e.g. solid particles or contaminants. Thus, the filter is preferably configured to inhibit, resist or prevent the flow of solid particles through the filter whilst still maintaining a low acoustic impedance to acoustic pressure waves through the filter. The filter may preferably be considered to act as a barrier to prevent the passage of particles without significantly altering the acoustic impedance to acoustic pressure waves incident on the membrane from a region outside, or beneath, the first (lower) surface of the substrate. Thus, the filter may be provided with a plurality of openings or holes which allow the flow of acoustic pressure waves through the filter.

The filter may be provided at, or near, the opening in the first side of the substrate. According to one example, the filter is provided with a filter layer in a plane which underlies the first side of the substrate. Thus, the filter may be formed within a layer of the transducer die which is provided underneath the first side of the substrate.

Alternatively or additionally, the filter may be provided with a filter layer at least partially embedded or recessed within the interior of the substrate cavity. In a configuration in which the filter is at least partially embedded within the interior of the substrate cavity, and according to one example, the embedded filter layer may, e.g. be provided within the substrate cavity at a distance (from the opening in the lower surface of the substrate) of the thicknesses of the filter layer plus between 10 and 20 um. According to one example, an embedded filter layer is provided within a distance of between 1 to 3 layer thicknesses inside the substrate cavity.

According to an example of a further aspect there is provided a method of fabricating a micro-electrical-mechanical system (MEMS) transducer on a substrate, the substrate having a cavity which extends from a first opening in a first side of the substrate to a second opening in a second side of the substrate, the method comprising:

providing a membrane layer supported relative to the substrate so as to overlie the cavity;

forming a filter layer on a lower surface of the substrate;

patterning the filter layer to form a filter within the substrate cavity or at the first opening of the substrate cavity.

The patterning of the filter layer may comprise:

depositing a sacrificial layer beneath the filter layer;

forming a predetermined pattern in the sacrificial layer;

performing an etching process from underneath the sacrificial layer, wherein the sacrificial layer is resistant to the etching process such that the predetermined pattern is transferred to the filter layer. The predetermined pattern may comprise one or more openings.

Prior to forming the filter layer, a volume of sacrificial material may be deposited within a back volume of the substrate, wherein the back volume defines the substrate cavity. The final level of the volume of sacrificial material may advantageously determine the location of the filter with respect to the substrate cavity. Specifically, the filter may be formed from a continuous layer which is formed on the lower surface of the substrate. Alternatively, the filter maybe formed from a layer deposited within the substrate cavity onto the sacrificial material to result in an embedded or recessed filter.

BRIEF DESCRIPTION OF THE FIGURES

For a better understanding of the present invention, and to show how the same may be carried into effect, reference will now be made by way of example to the accompanying drawings in which:

FIG. 3b illustrates a plan view of the filter layer shown in FIG. 3a;

FIG. 3a shows a MEMS transducer according to a first example embodiment. The MEMS transducer 200 is a capacitive MEMS microphone device 200 similar to the transducer shown in FIG. 1. The device 200 comprises a flexible membrane layer 1 which is supported above a cavity (or through hole) 8 formed in a silicon die substrate 101 and in the oxide layer 103 formed thereon. A first electrode 3 is mechanically coupled to the flexible membrane, and together they form a first capacitive plate of the capacitive microphone device. A second electrode 2 is mechanically coupled to a generally rigid structural layer or backplate 4, which together form a second capacitive plate of the capacitive microphone device.

The transducer further comprises a filter 201 which, in this arrangement, is formed as a layer provided directly on a lower surface of the substrate. FIG. 3b illustrates a plan view of the filter layer. The filter 201 therefore extends across the cavity opening in the lower surface of the substrate. The filter 201 is arranged so as to separate the substrate cavity 8 from a region 6 outside the substrate cavity 8. The filter 201 is preferably adapted to inhibit the passage of particles through the filter. Thus, the filter 201 acts as a barrier to inhibit the passage of particles, preferably without significantly altering the acoustic impedance of a flow path from the region 6 to the cavity 8. The filter 201 is provided with a plurality of perforations, openings or holes 202 which substantially allow the flow of acoustic pressure waves through the filter. The openings are preferably 5 μm to 15 μm.

Figure 1:
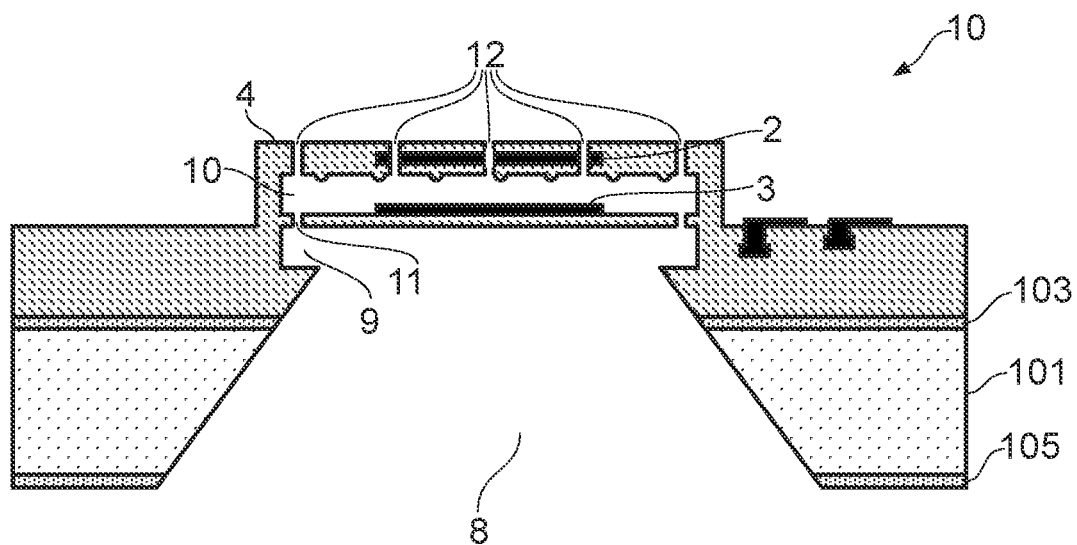
FIG. 1 is a schematic cross-sectional view of a MEMS microphone.

Arrangements according to example embodiments of the present disclosure advantageously provide an environmental barrier that is an integral part of the MEMS transducer die. That is to say, the MEMS transducer die and the environmental barrier are both formed from a monolithic semiconductor structure. The environmental barrier may beneficially serve to inhibit or prevent solid particle contaminants before they reach the membrane structure of the transducer. Thus, the filter may serve to alleviate the risk of performance degradation, corrosion or other undesirable consequences of contamination within the MEMS transducer. In particular, by positioning the filter at or near the bottom of the die structure, for example within a layer provided underneath the substrate or a short distance inside the substrate cavity, the filter acts as an environmental barrier at the beginning of an acoustic path through the substrate thereby preventing the risk that contaminants may build-up within the cavity. The filter located in this way may also prevent any material such as epoxy glue/adhesive used during the process of attaching the die to a substrate from flowing into the through hole, thereby altering the volume of the through hole and potentially altering the high frequency response of the microphone. Furthermore, it will be appreciated that in comparison to previously proposed designs where there is a risk of stiction between the membrane and the filter, the provision of a filter within the substrate cavity and/or positioned near the bottom of the transducer die ensures that the filter does not undermine the robustness of the device.

Furthermore, according to examples according to the present aspect, the filter may serve to dampen pressure shock waves generated during a high pressure event such as if the device is dropped or at electrostatic discharge. Thus, examples described herein may benefit from improved robustness.

The filter may preferably be fabricated from the material that is deposited to form one of the layers of a MEMS transducer die that is commonly provided below the substrate. For example, in order to counter balance the bow of the wafer that arises due to the intrinsic stress of the various layers that are deposited on the top of the surface substrate, it is known to provide a stress compensation layer underneath the silicon substrate. The stress compensation layer, which is typically formed of a dielectric layer, such as silicon nitride dielectric layer, may be engineered to provide the required properties of the filter. Thus, the layer can be lithographically patterned to provide particle filtering capabilities whilst also minimising the impact of the filter on the acoustical resistance of the acoustic path to the membrane. According to one example, the dielectric layer may be deposited with sufficient rigidity/stiffness that the compliance of the filter may be kept to a minimum preventing any interaction with movable diaphragm or the back plate of the microphone.

Thus, according to one example, one or more of the layers of the transducer that are provided on the lower surface of the substrate may be configured to form an environmental filter. Such a layer, or layers, advantageously serves a dual purpose, or provides dual functionality, to the device—e.g. by providing filtering capabilities in addition to stress compensation to counterbalance any bow arising in the wafer, thereby representing a particularly cost effective solution.

The filter may be formed of a silicon nitride ($Si_3N_4$). According to one example, the filter is formed of a layer of silicon nitride which additionally functions as a stress compensation layer of the transducer.

Although silicon nitride is the presently preferred material for the filter, it will be appreciated that various other materials may be employed. For example, silicon oxide or BPSG. Furthermore, the use of crystalline/amorphous and polycrystalline silicon is also possible. Alternatively metallic materials such as NiCr and TiN may be used.

The filter may be provided on one or both sides with a hydrophobic coating which will serve to resist the build-up of water molecules on the filter. For example, one or more of the surfaces of the filter may be coated on with a hydrophobic material such as polytetrafluoroethylene, PTFE ($C_2F_4$) commonly used and wall passivation in deep reactive ion etch (Bosch) process. Thus, the filter may further serve as a hydrophobic barrier to inhibit water molecules from entering the substrate cavity and, thus, the acoustic cavities above and below the transducer membrane.

Methods for fabricating a MEMS transducer according to the present examples may develop the techniques described in an earlier patent application filed by the same Applicant, namely GB2436460B. This patent describes a method of fabricating a MEMS capacitive transducer using a first sacrificial layer to facilitate the formation of the first cavity 9 located directly below the membrane, and a second sacrificial layer to facilitate the formation of the second cavity 10 interposed between the first and second electrodes 2 and 3. The formation of the first cavity 9 using the first sacrificial layer means that the etching of the back-volume to form the substrate cavity does not play any part in defining the diameter of the first cavity and, thus, the membrane. This technique allows the diameter of the first cavity and thus the membrane to be accurately controlled.

FIGS. 4 to 14 are schematic cross-sectional and/or perspective views illustrating the fabrication process for the MEMS microphone shown in FIG. 1. In the description of FIGS. 4 to 14 it is noted that various dimensions (both written and illustrated) are provided as examples only.

Figure 4:
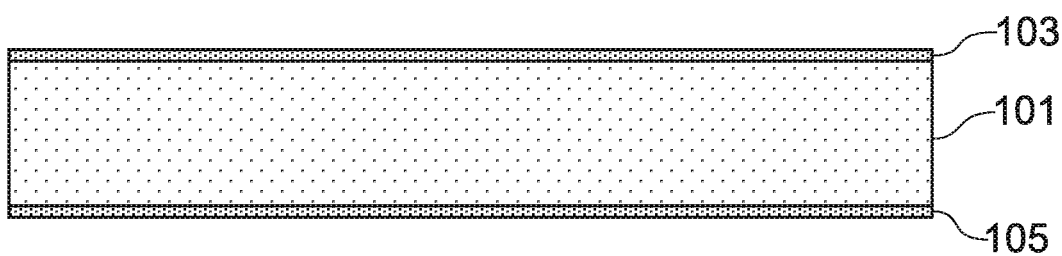
FIGS. 4 to 14 are schematic cross sectional views and perspective views illustrating the fabrication process for the MEMS microphone detailed in FIG. 1.

Referring to FIG. 4, the fabrication process of the MEMS device is based on a substrate 101. In this example, for integration with CMOS electronics and CMOS processing techniques the substrate 101 is a silicon wafer, but it will be appreciated that other substrate materials and electronic fabrication techniques could be used instead. The silicon substrate 101 is subjected to thermal oxidation to form thermal oxidation wafer layers 103 and 105. As an alternative to using thermal oxidation, the oxide layers may be deposited using a plasma enhanced chemical vapour deposition (PECVD). The silicon substrate 101 has a thickness, for example, in the range 300 um to 1000 um, for example 625 um.

Figure 5A:
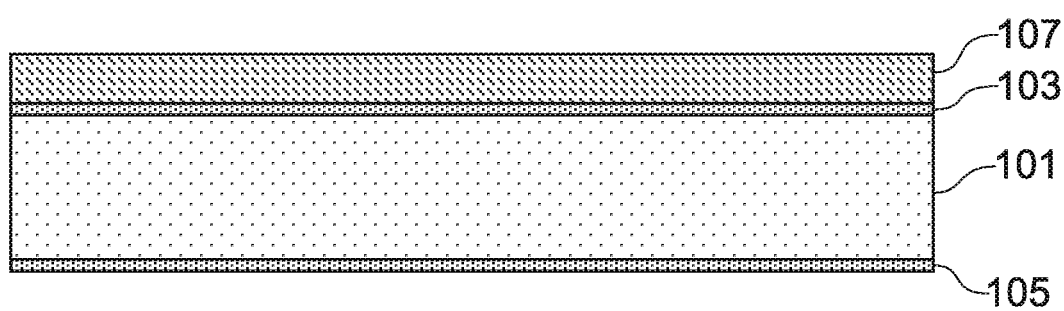
Figure 5B:
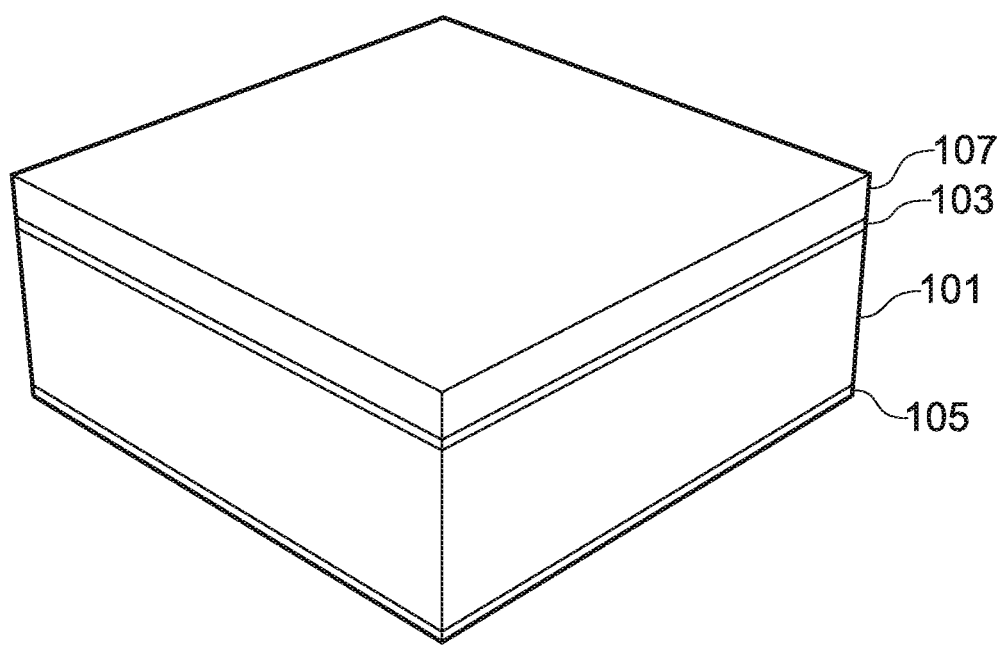

In FIG. 5 a dielectric layer, for example a silicon nitride dielectric layer 107, is deposited on the thermal oxidation wafer layer 103. The silicon nitride dielectric layer 107 can be deposited using a process such as plasma enhanced chemical vapour deposition (PECVD) at a temperature of 300° C. The silicon nitride dielectric layer 107 acts as an etch stop layer during subsequent processing of the MEMS device (and in particular in relation to the etching of the back-volume illustrated in FIG. 16b. Preferably the silicon nitride dielectric layer 107 has a thickness in the range 2.3 um to 2.7 um, for example 2.5 um, and a tensile stress of between 25 to 75 MPa, for example 50 MPa. It will be appreciated that other dielectric layers and/or processes may be used. For example the layer might not be pure silica—BoroPhosphoSilicate Glass or BPSG may also be used as it can be deposited at lower temperatures. It will be appreciated by a person skilled in the art that the stress of a layer will not only relate to the thickness of the layer, but also the deposition conditions.

Figure 6A:
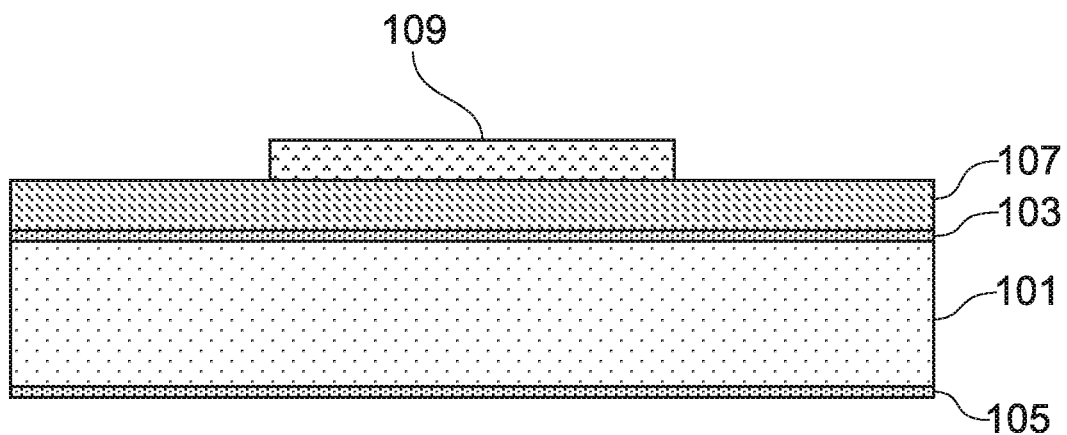
Figure 6B:
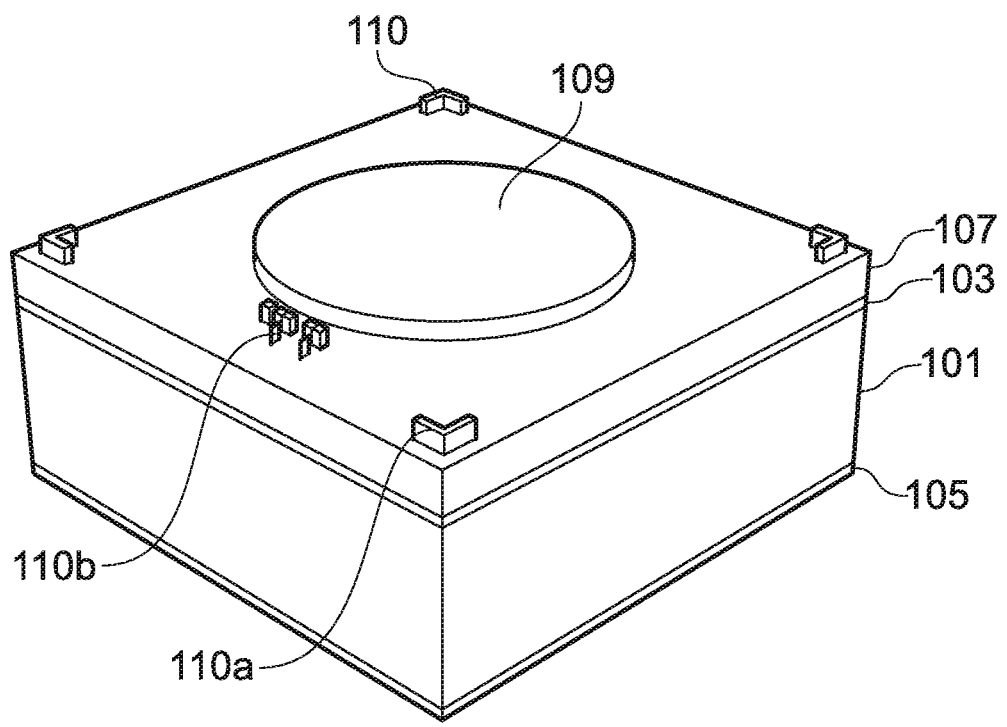

Next, referring to FIG. 6a, a first sacrificial layer 109 is formed on the silicon nitride dielectric layer 107 by depositing and etching a coating. To ensure compatibility with CMOS fabrication techniques, the first sacrificial layer 109 can be made of a number of materials which can be removed using a dry release process. Using a dry release process is advantageous in that no additional process steps or drying are required after the sacrificial layer is released. Polyimide is preferable as the sacrificial layer (for example Hitachi Dupont polyimide P12610 or P12545), as it can be spun onto the substrate easily and removed with an oxygen plasma clean. The polyimide coating is spun on the wafer to form a conformal coating, and subsequently cured at a temperature of 200° C. for 30 minutes in air at atmospheric pressure, and then at 375° C. for 30 minutes in a flowing nitrogen environment at atmospheric pressure. It will be appreciated by a person skilled in the art that the values of these parameters are provided as examples only and that any conditions suitable to deposit a polyimide sacrificial layer may be envisaged. A primer may be used for the polyimide layer, such as HD VM651 for example. The polyimide layer is then patterned with photoresist and etched in an anisotropic oxygen plasma, thus leaving the first sacrificial layer 109 as shown in FIG. 6a. The first sacrificial layer 109 has a thickness, for example, of between 0.9 um to 1.1 um, for example 1 um. It will be appreciated by a person skilled in the art that alternative methods of depositing the first sacrificial layer 109 may be used, for example applying and etching a photosensitive polyimide.

The first sacrificial layer 109 defines the dimensions and shape of the cavity underneath the membrane (i.e. the first cavity 9 in FIG. 1) that will be left when the first sacrificial layer 109 is removed as discussed below.

Figure 7A:
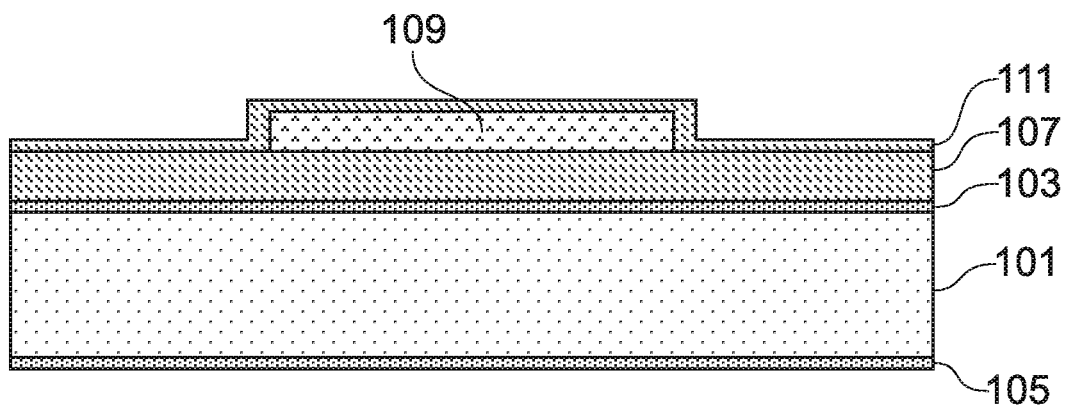
FIGS. 17a to 7h illustrate various MEMS transducer packages.
Figure 7B:
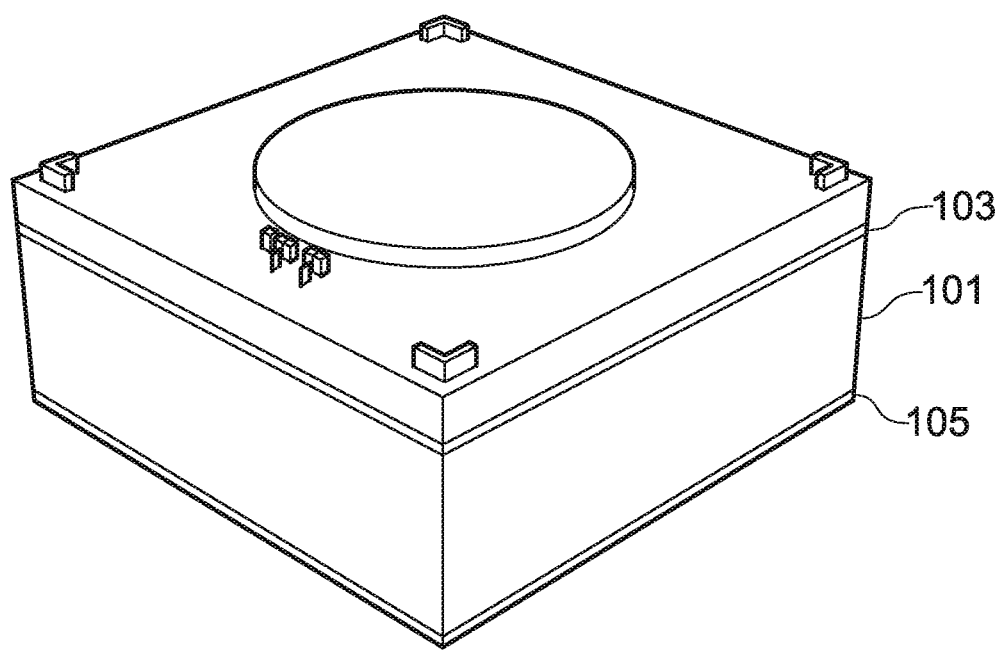

In FIG. 7 a diaphragm layer, for example a silicon nitride diaphragm layer 111, is deposited over the silicon nitride dielectric layer 107 and the first sacrificial layer 109. Part of the silicon nitride diaphragm layer 111 is used in the formation of the membrane of the microphone (i.e. the membrane 1 in FIG. 1). The silicon nitride diaphragm layer 111 has a thickness, for example of between 0.38 um to 0.42 um, for example 0.4 um, and a tensile stress of between 40 to 50 MPa, for example 45 MPa.

It is noted that the membrane 1 may be formed from materials other than silicon nitride. For example, the membrane may also be polysilicon. Alternatively, the membrane may be part of a sandwich structure comprising metal/nitride/metal or nitride/metal/nitride. For example, a composite stack could be formed from aluminium/silicon nitride/aluminium (having thicknesses, for example, of 50 nm/400 nm/50 nm). Alternatively, the metal layer may be buried in a composite stack formed from silicon nitride/aluminium/silicon nitride (having thicknesses, for example, of 200 nm/50 nm/200 nm). In addition, titanium adhesive layers may be used between the aluminium and the silicon nitride. The formation of a sandwich structure has the advantage of reducing unwanted deformation in the membrane.

Figure 8A:
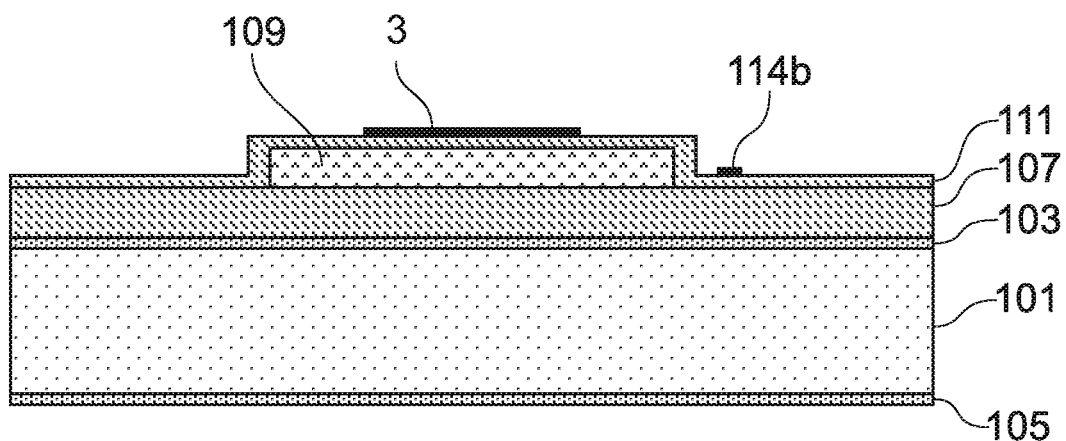

Next, referring to FIG. 8a, a first electrode 3 is formed by depositing or sputtering a conducting material, for example aluminium, on the silicon nitride diaphragm layer 111. Preferably the first electrode 3 has a thickness in the range 0.04 um to 0.06 um, for example 0.05 um, and a tensile stress of between 175 to 225 MPa, for example 200 MPa. It is noted that these thicknesses and stress values are based on the first electrode being made from aluminium, and that other thicknesses and stress values may apply from electrodes made from other materials.

Although the preferred material for the first electrode 3 is aluminium, a person skilled in the art will realise that the first electrode 113 may comprise any other conductive material e.g. AlSi, AlSiCu, Ti, TiW, Cu, Ni, NiCr, Cr, Pt, Ta or Pd suitable for use as the electrode material.

Figure 8B:
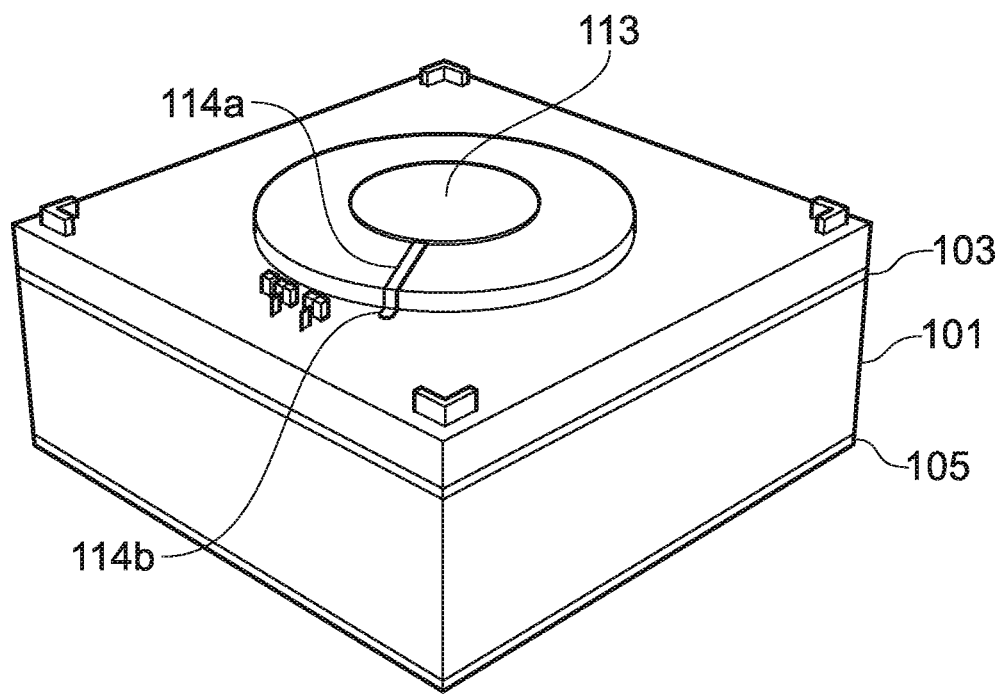

A perspective view of the first electrode 3 is shown in FIG. 8b, which shows how the first electrode 3 has an associated track 114a and pad 114b for interconnecting the first electrode to other circuitry, either on the same substrate or a different integrated circuit. The track 114a is not shown in FIG. 8a due to the nature of the cross-section taken.

Figure 9:
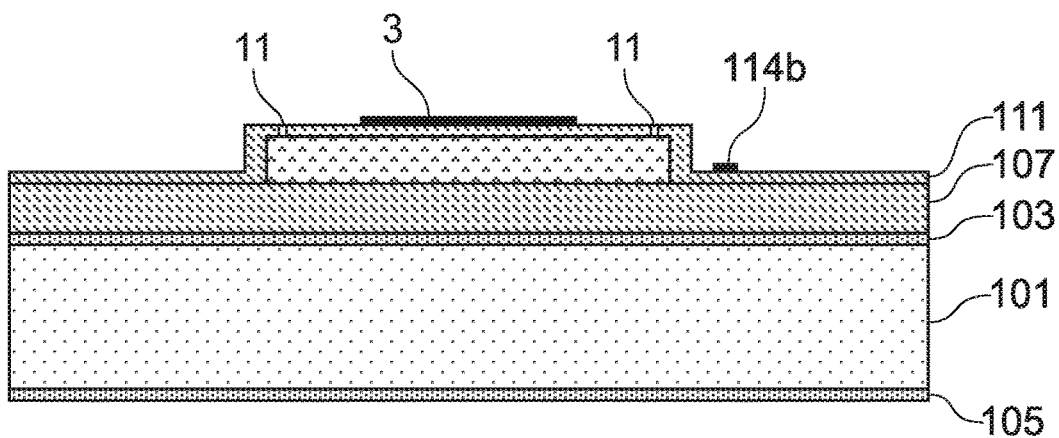

In FIG. 9 a plurality of openings or bleed holes 11 are formed in the membrane region of the silicon nitride diaphragm layer 111. The bleed holes 11 may be formed by etching the holes in the silicon nitride diaphragm layer 111. The bleed holes 11 may be about 2 um in diameter, for example.

Figure 10A:
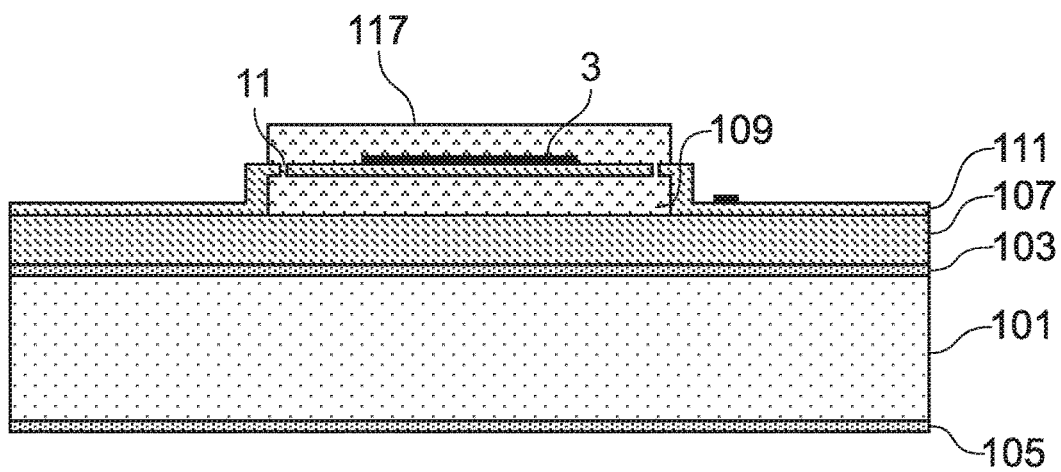
Figure 10B:
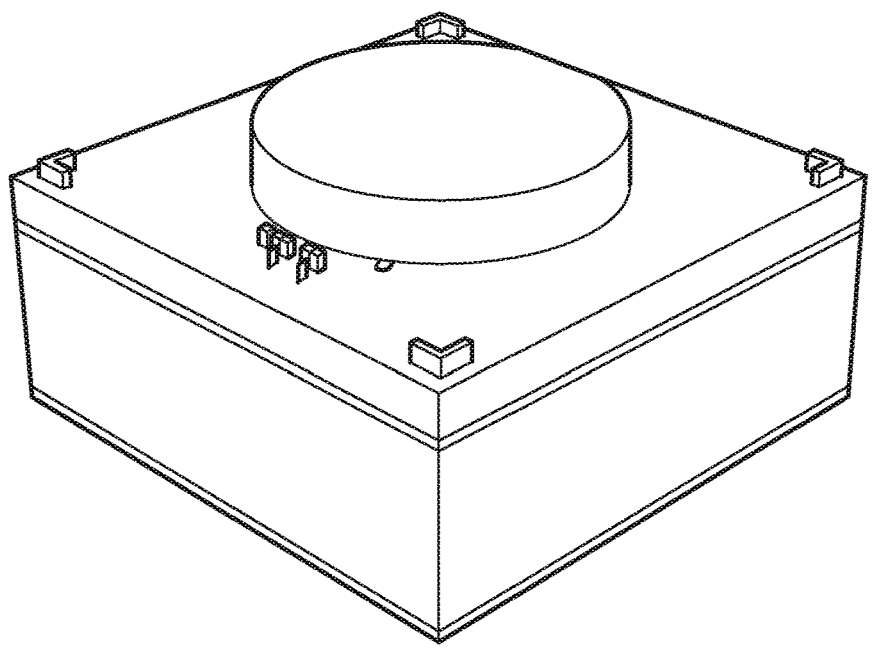

In FIG. 10a a second sacrificial layer 117, preferably a polyimide layer the same as or similar to the first sacrificial layer 109, is deposited over the silicon nitride diaphragm layer 111, such that the second sacrificial layer 117 covers the first electrode 3 and the bleed holes 11. The second sacrificial layer 117 defines the dimensions and shape of the cavity above the membrane (i.e. the second cavity 10 in FIG. 1) that will be left when the second sacrificial layer 117 is subsequently removed as discussed below. The second sacrificial layer 117 has a thickness, for example, of between 2.1 um to 2.3 um, for example 2.2 um. Although the second sacrificial layer 117 is shown as having approximately the same dimensions as the first sacrificial layer 109, it is noted that the first and second sacrificial layers 109, 117 may have different dimensions, for example different thicknesses and/ or different diameters. FIG. 10b shows a perspective view of the device with the second sacrificial layer 117 added.

Figure 11A:
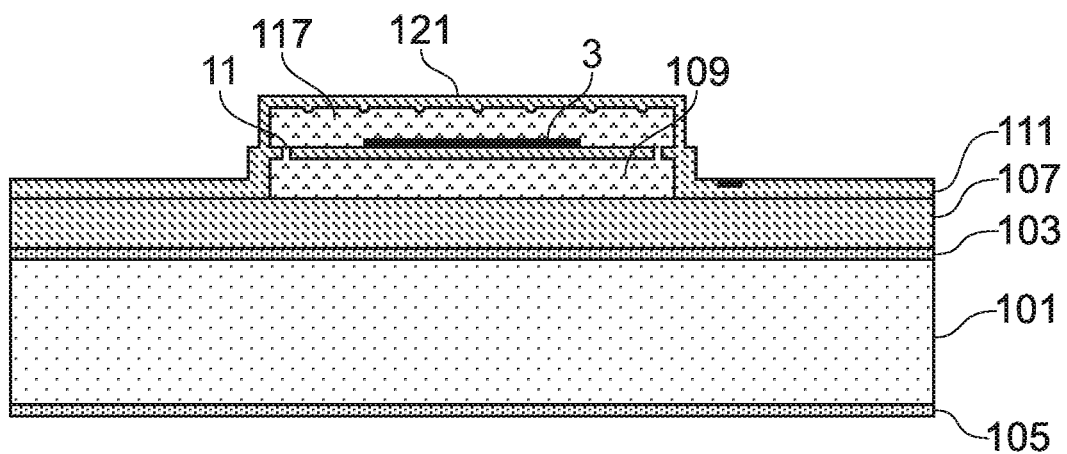
Figure 11B:
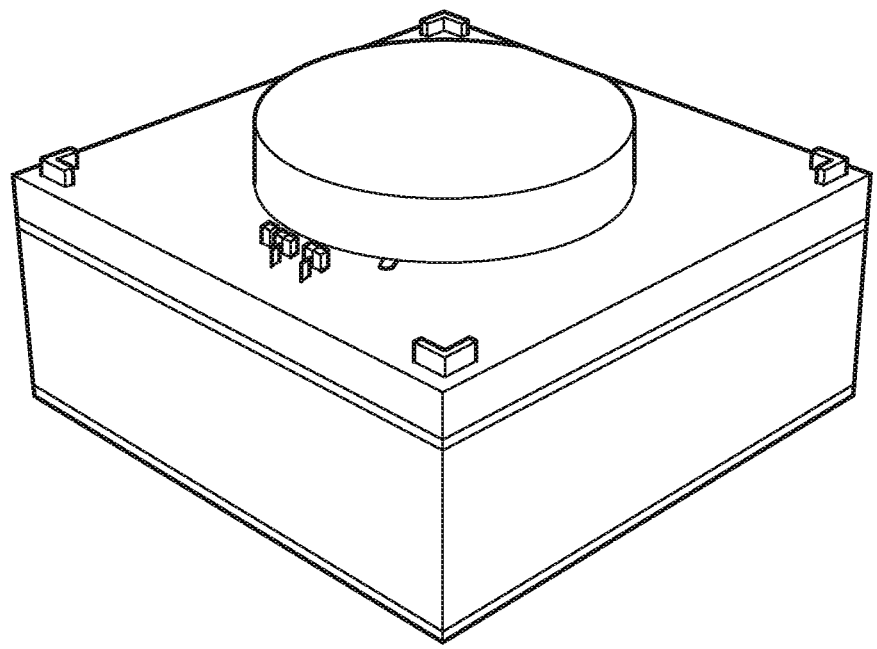

A back-plate for supporting a second electrode is then formed by first depositing a lower silicon nitride back-plate layer 121 as shown in FIG. 11a. The lower silicon nitride back-plate layer 121 can be deposited using the PECVD process at 300° C. as described above. The lower silicon nitride back-plate layer 121 has a thickness, for example, of between 0.28 um to 0.32 um, for example 0.3 um, and a tensile stress of between 50 to 200 MPa, for example 100 MPa. FIG. 11b shows a perspective view of the device with the silicon nitride back-plate layer 121 added.

Figure 12A:
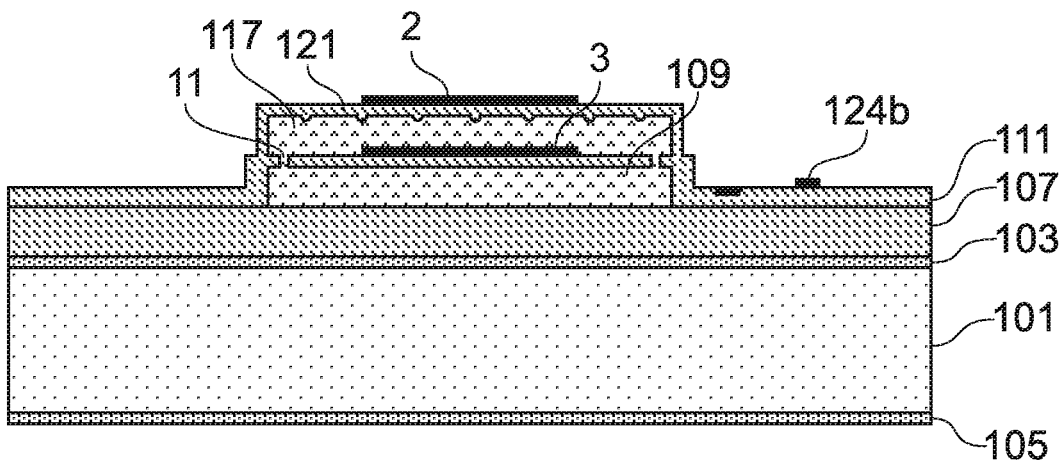
Figure 12B:
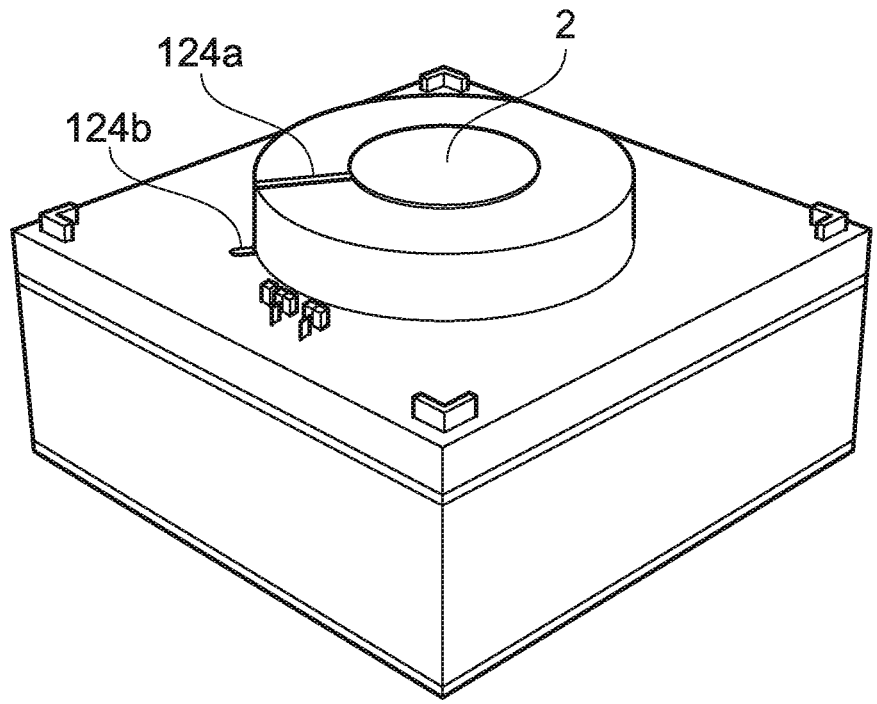

The second electrode 2 is then formed as shown in FIG. 12a, by depositing a conducting layer, for example aluminium, on the lower silicon nitride back-plate layer 121. The second electrode 123 has a thickness, for example, of between 0.09 um and 0.11 um, for example 0.1 um. FIG. 12b shows a perspective view of the second electrode 2 and its associate track 124a and pad 124b for connection to other circuit components. It will be appreciated that the track 124a is not shown in FIG. 12a due to the nature of the cross-section taken.

As with the first electrode 3, the material for the second electrode 123 may comprise any conductive material e.g. Al, AlSi, AlSiCu, Ti, TiW, Cu, Ni, NiCr, Cr, Pt, Ta or Pd suitable for use as the electrode material.

Figure 13A:
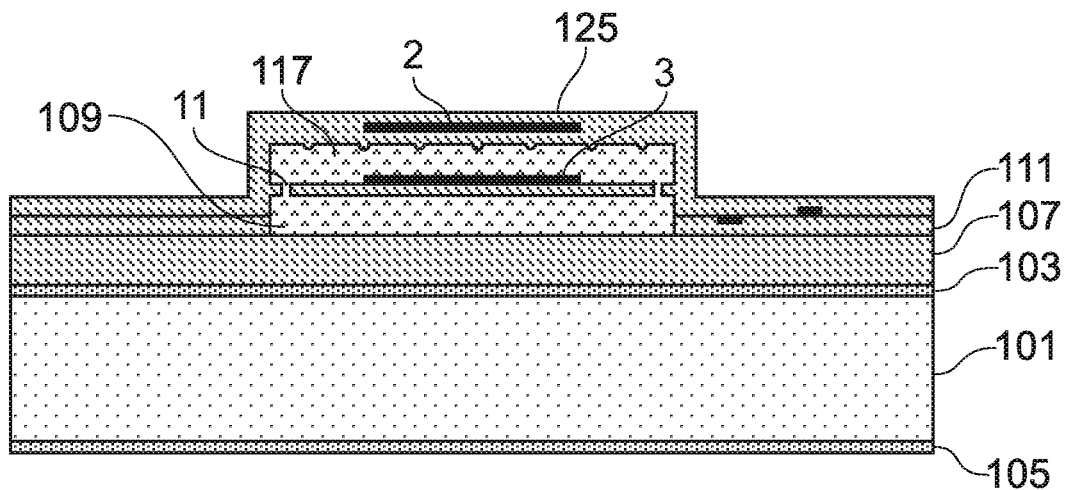
Figure 13B:
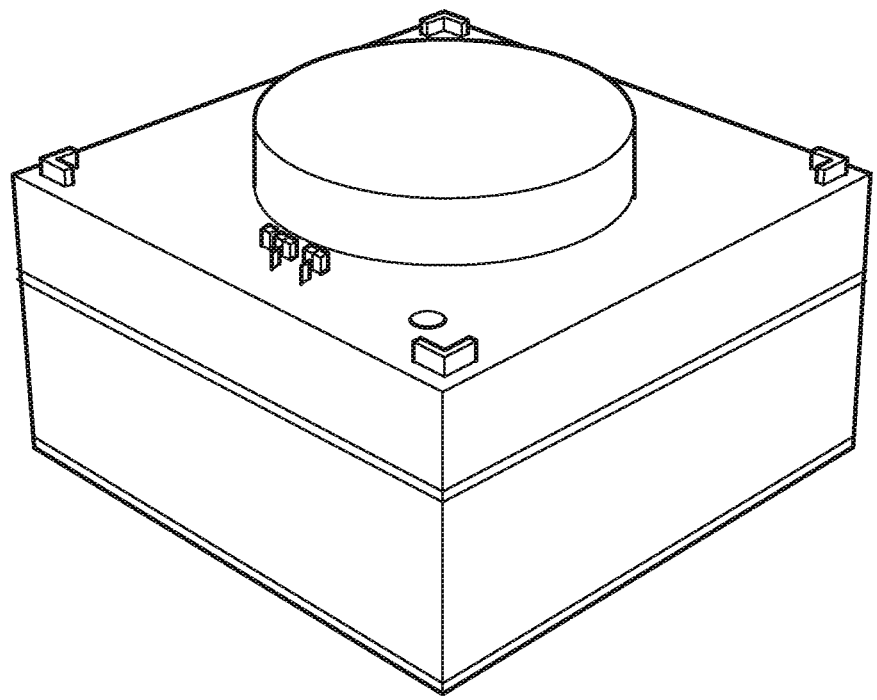

Next, in FIG. 13, the back-plate 4 is formed by depositing an upper silicon nitride back-plate layer 125. The upper silicon nitride back-plate layer 125 can, for example, be deposited using a PECVD process at 300° C. The upper silicon nitride back-plate layer 125 has a thickness, for example, of between 2.1 um to 2.3 um, for example 2.2 um, and a tensile stress of between 125 to 175 MPa, for example 150 MPa.

Figure 2:
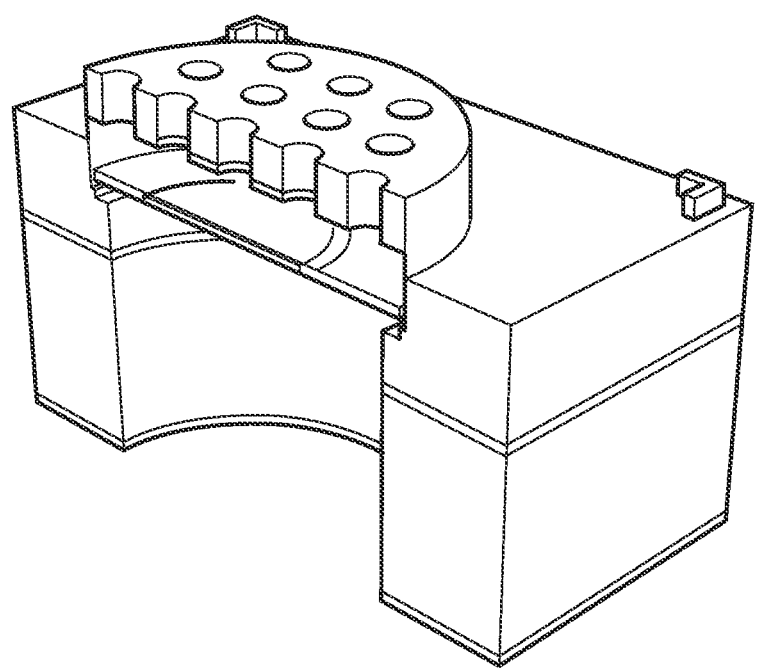
FIG. 2 is a perspective view of the MEMS microphone shown in FIG. 1.
Figure 3A:
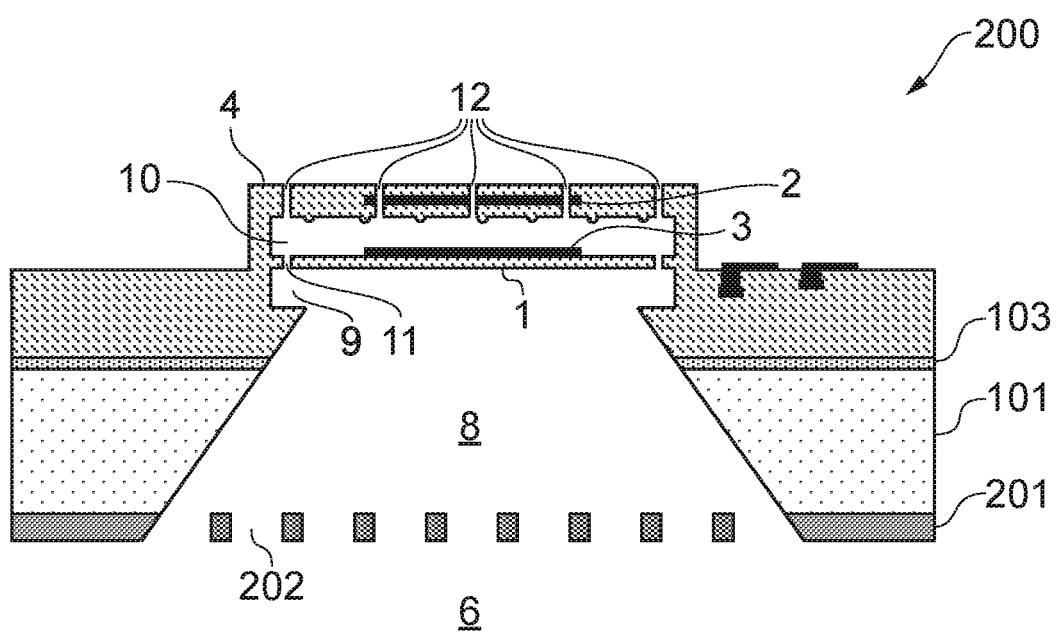
FIG. 3a is a schematic cross-sectional view of a MEMS microphone according to a first example.
Figure 3B:
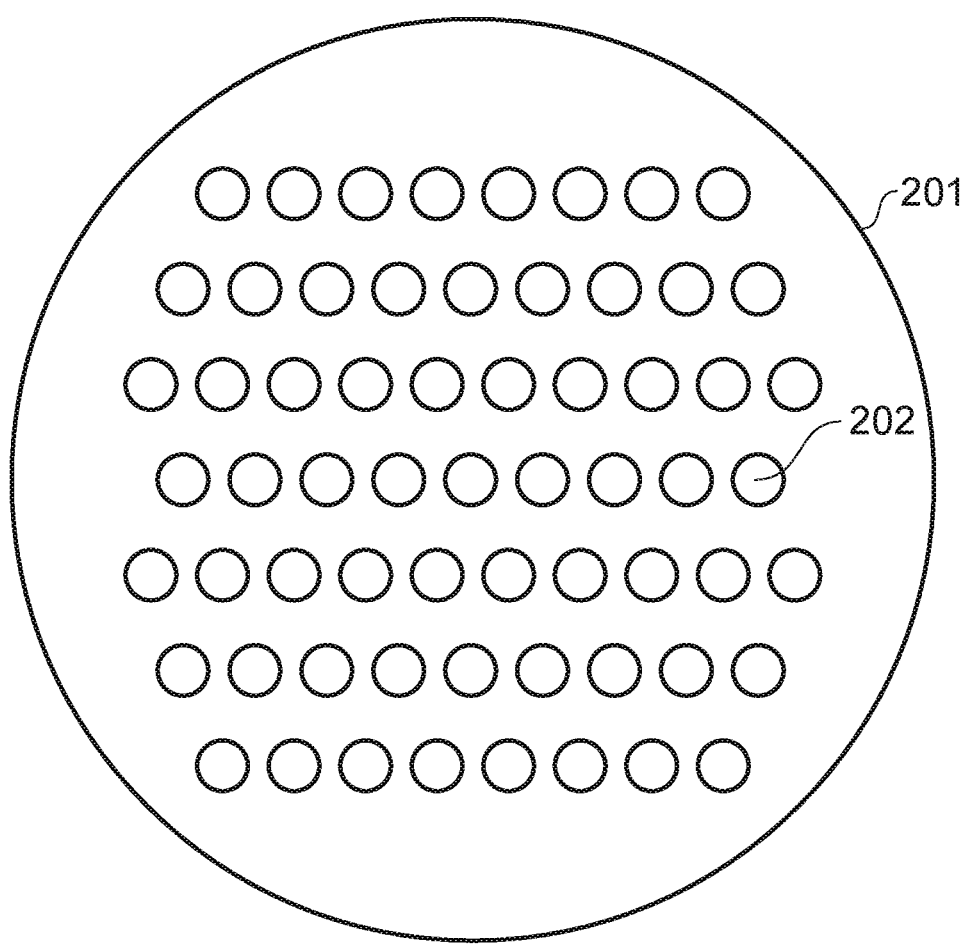

The lower and upper silicon nitride back-plate layers 121, 125 define the structurally rigid back-plate 4 of FIG. 2 that supports the second electrode 3. The back-plate is configured to have a greater measure of stiffness than the membrane.

Figure 14A:
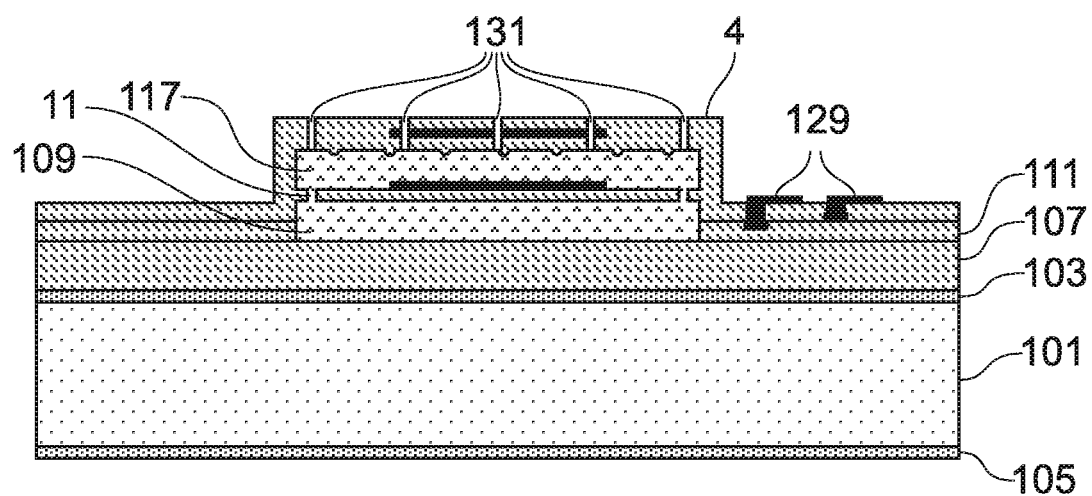
Figure 14B:
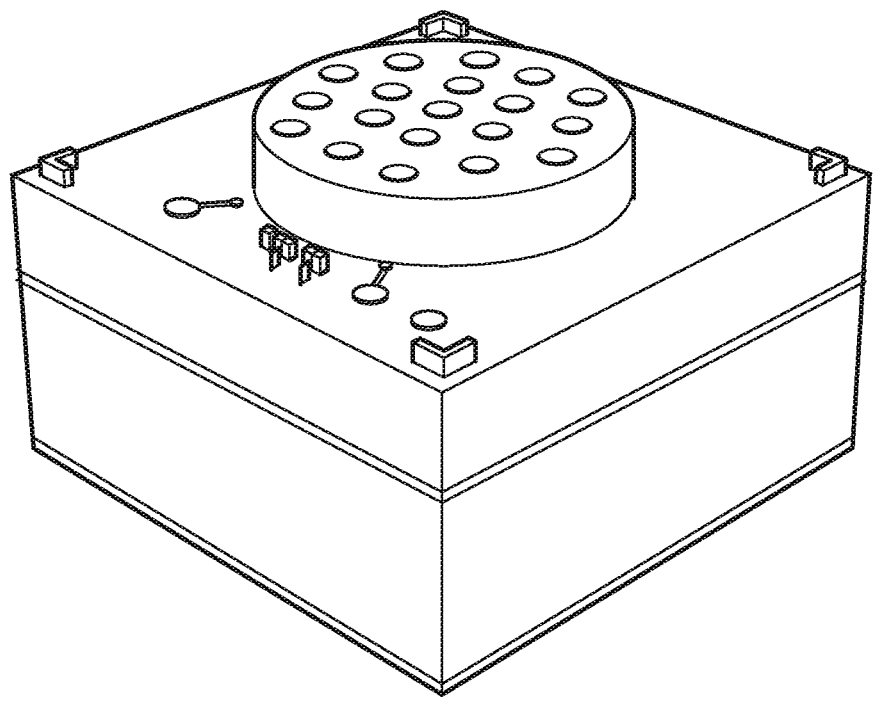

In FIG. 14, pad connection holes 127 have been etched in the upper silicon nitride layer 125 to provide connectivity to pads of the electrode tracks of the first and second electrodes 113, 123 and a pad thickening mask 129 has been applied.

As shown in FIG. 14a, a plurality of acoustic holes 131 are formed in the upper silicon nitride back-plate layer 125. The acoustic holes 131 extend to the second sacrificial layer 117. The acoustic holes 131 subsequently allow the second sacrificial layer 117 (and parts of the first sacrificial layer 109 through the bleed holes 11) to be etched from above the wafer. During use of the microphone device, i.e. after the removal of the sacrificial layers, the acoustic holes 131 allow sound waves to pass to the membrane.

A number of example methods for fabricating a MEMS transducer having a filter will now be described. The example methods may conveniently involve the additional processing of a MEMS transducer die substantially as shown in FIG. 14a.

Figure 15A:
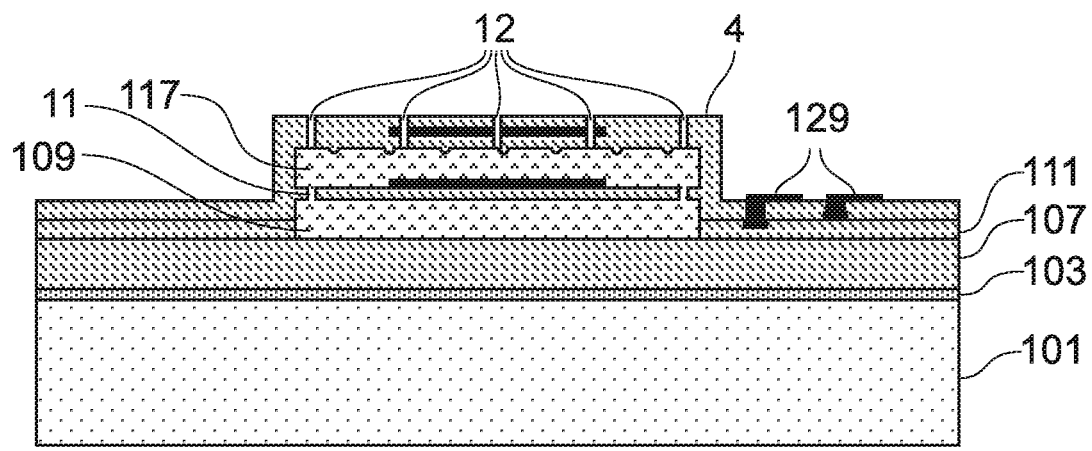
FIGS. 15a to 15f are schematic cross sectional views illustrating a fabrication process for a MEMS microphone according to a first example method.

Thus, FIGS. 15a to 15f illustrate the fabrication of a MEMS transducer having a filter according to a first example method. In FIG. 15a a transducer die similar to the transducer shown in FIG. 14a is illustrated except that the die in FIG. 15a is not provided with oxidation layer 105 on the lower surface of the substrate as illustrated in FIG. 14a.

Figure 15B:
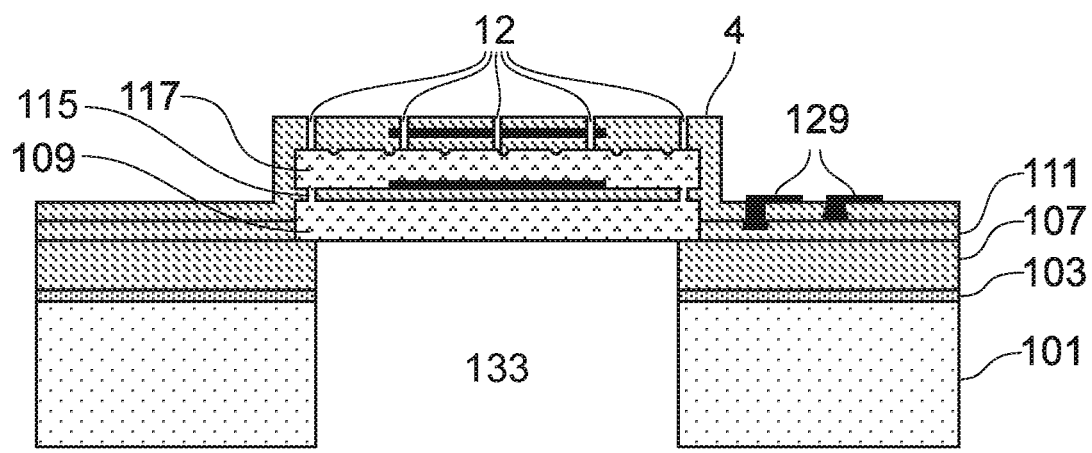

Referring to FIG. 15b, a back-volume 133 is formed by etching from underneath the substrate up to the silicon nitride dielectric layer 107 which acts as a first etch stop. The etch involves patterning the back of the wafer with resistance, and this pattern is then transferred to the silicon nitride dielectric layer 107 on the back of the wafer and which is not attacked by the wet etch chemical. The mask pattern will typically be square and aligned to the wafer crystal planes. A further etch is then performed through the silicon nitride dielectric layer 107 to the first sacrificial layer 109 which acts as a polyimide etch stop.

For ease of illustration, the sides of the back-volume shown in FIG. 15b have been shown to be parallel. However, it will be appreciated that the sides of the back volume will tend to converge inwards as they approach the membrane, as shown in the more realistic illustration in FIG. 1.

Figure 15C:
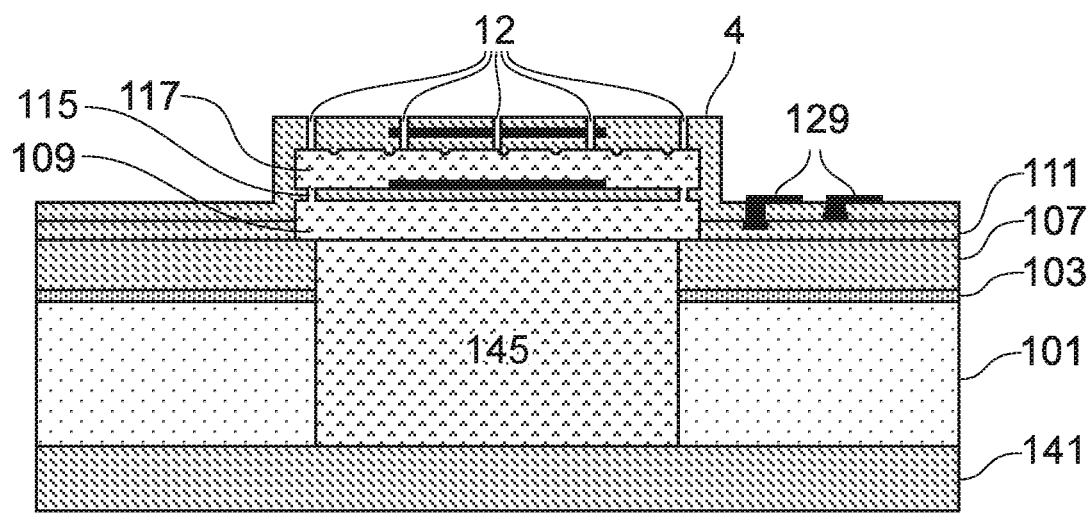
Figure 15D:
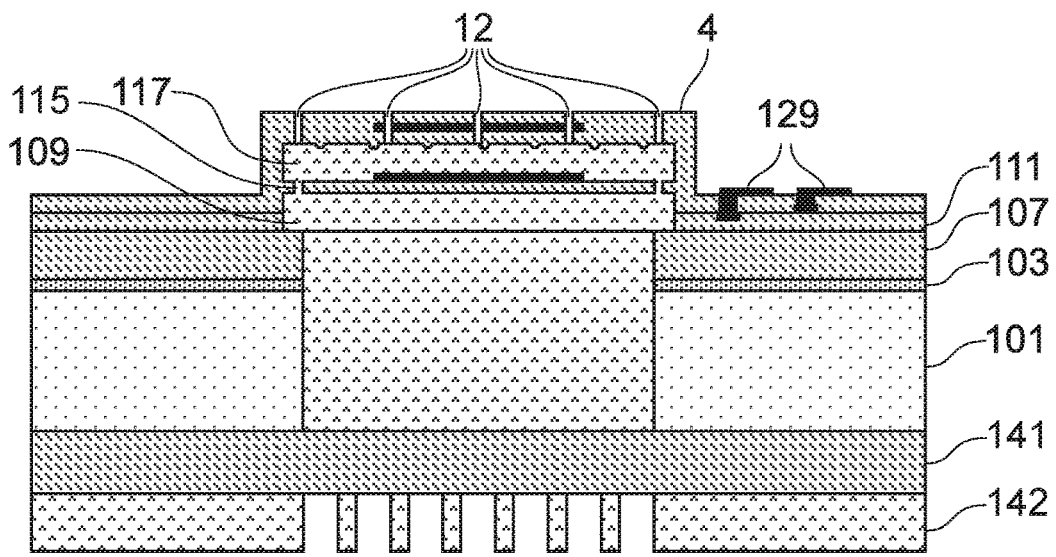

The back volume 133 is then filled with a sacrificial material 145 such as polyimide and subsequently planarised. A layer 141 of silicon nitride dielectric is deposited on the lower surface of the substrate as shown in FIG. 15c, e.g. using a process such as plasma enhanced chemical vapour deposition.

Figure 16A:
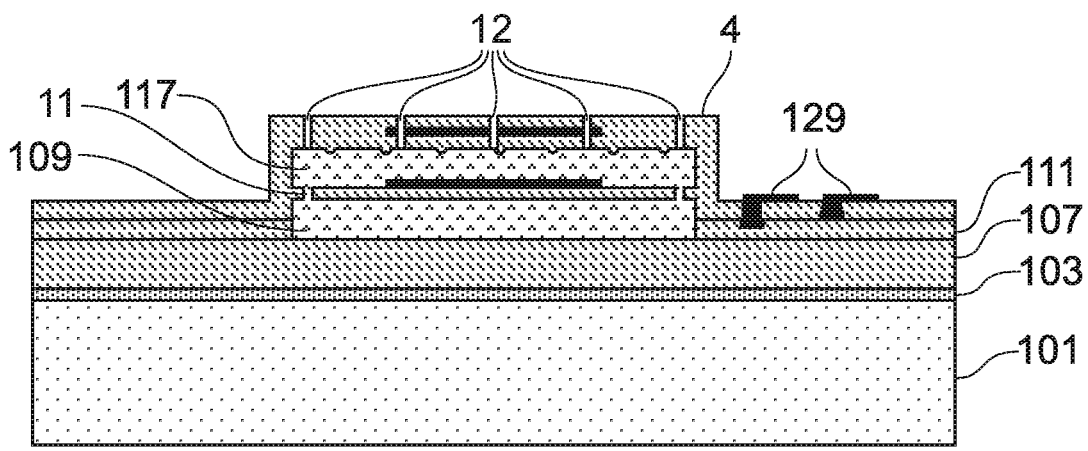
FIGS. 16a to 16f are schematic cross sectional views illustrating a fabrication process for a MEMS microphone according to a second example method.
Figure 16B:
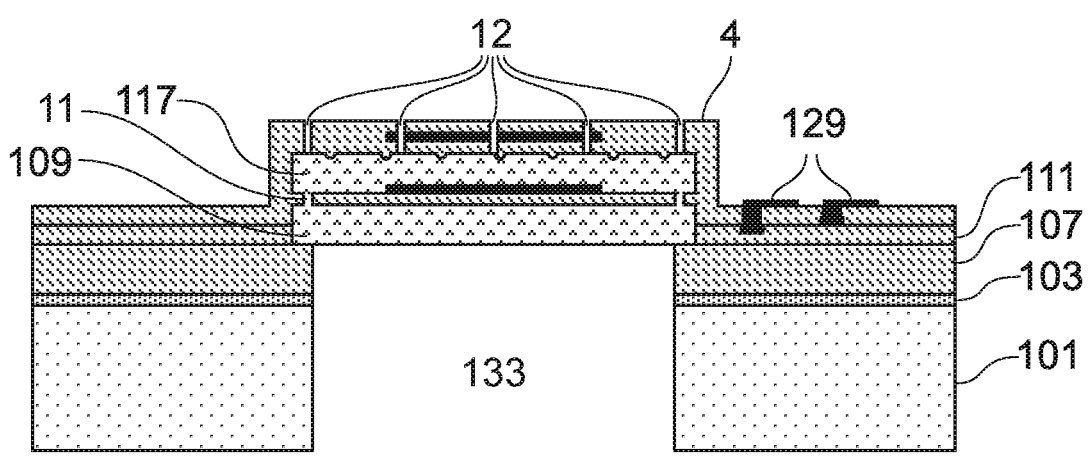
Figure 16C:
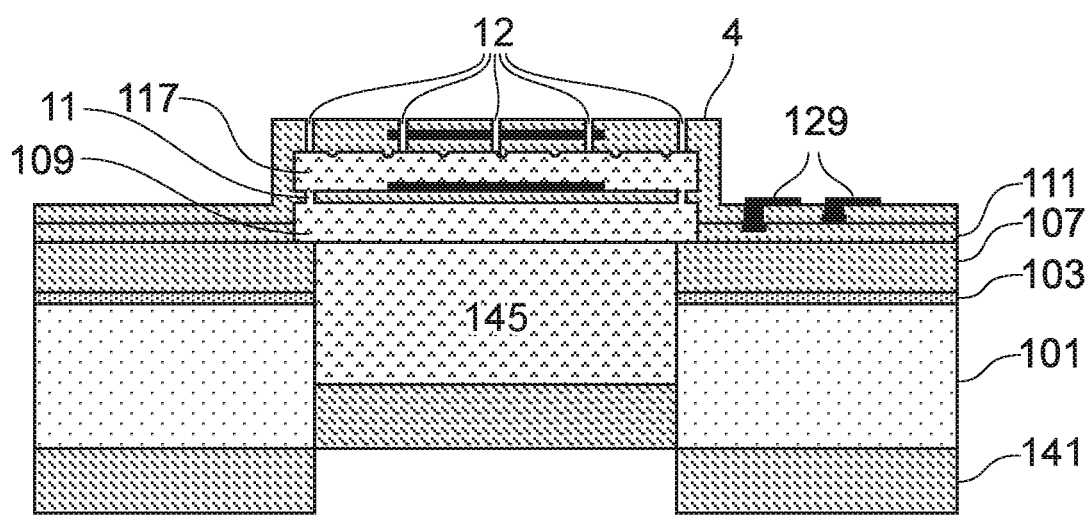
Figure 16D:
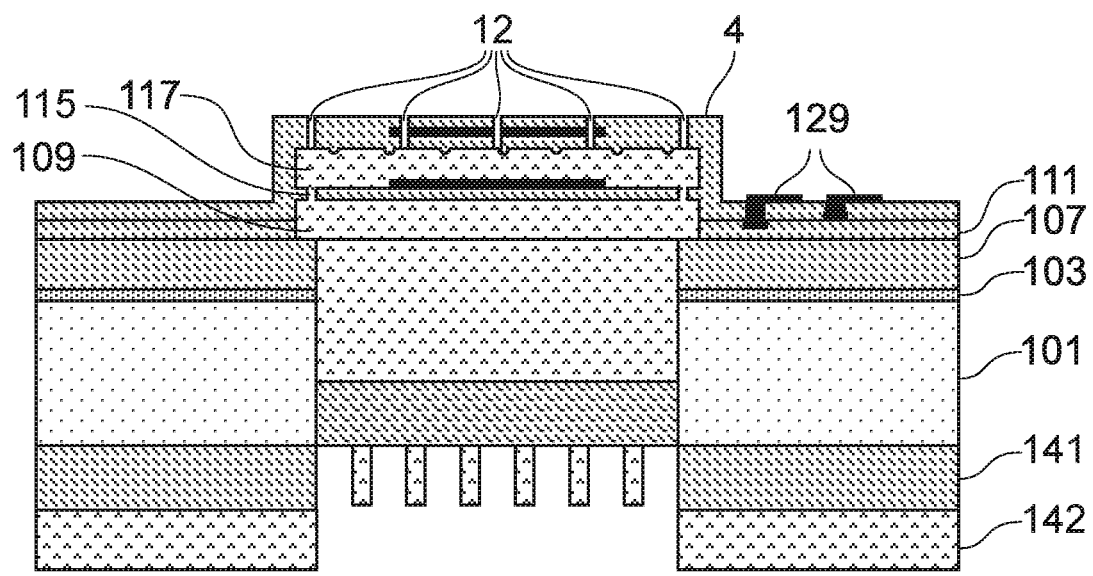

A further sacrificial layer 142 of e.g. polyimide is despotised on the layer 141 of silicon nitride and is patterned using a pattern mask layer as shown in FIG. 16d.

Figure 15E:
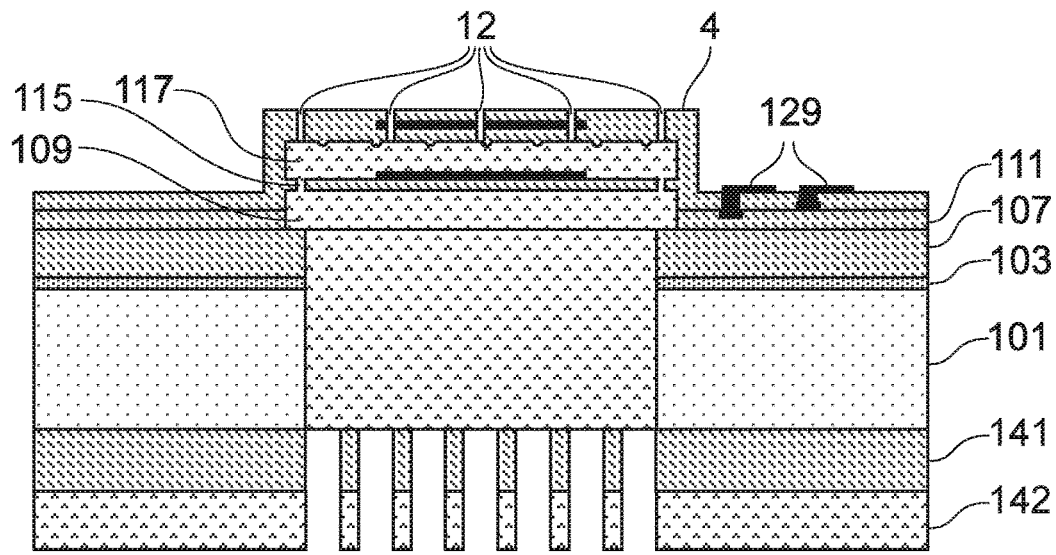

An etch is performed from underneath the substrate, with the regions of the layer 141 that are beneath the patterned sacrificial layer being protected from the etching process, thus resulting in a patterned silicon nitride layer 141 as shown in FIG. 15e.

Figure 15F:
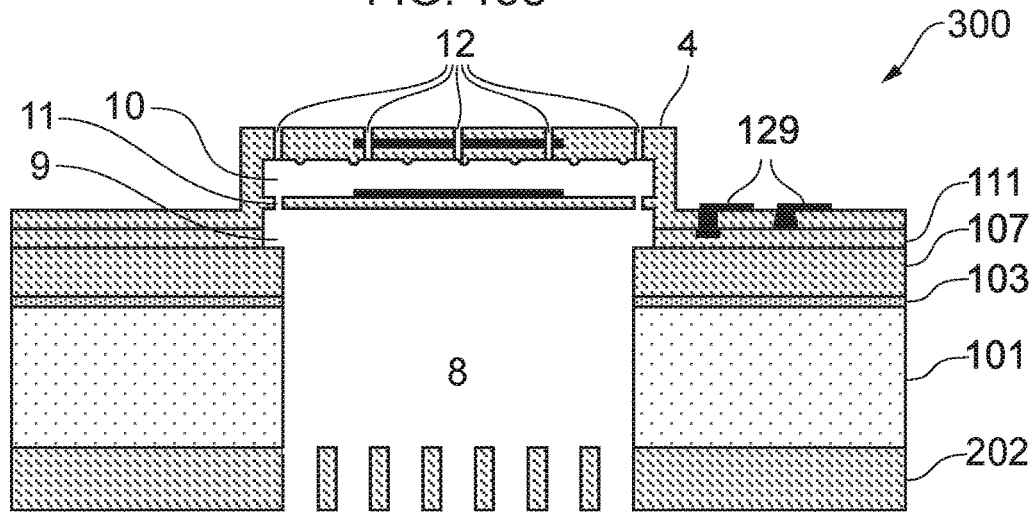

Finally, removal of all of the sacrificial layers takes place to produce the MEMS transducer as shown in FIG. 15f. Thus, FIG. 15f illustrates a MEMS transducer 300 according to a second example embodiment having an integrated filter 202.

The layer 141 may further act as, e.g. a stress compensation layer of the transducer.

FIGS. 16a to 16f illustrate the fabrication of a MEMS transducer having a filter according to a second example method. In FIG. 16a a transducer die similar to the transducer shown in FIG. 14a is illustrated except that the die in FIG. 16a is not provided with oxidation layer 105 on the lower surface of the substrate as illustrated in FIG. 14a.

Referring to FIG. 16b, a back-volume 133 is formed by etching from underneath the substrate.

A volume 145 of sacrificial material is then deposited into the back volume 133. However, in contrast to the first example method described above with respect to FIG. 15, the sacrificial material does not entirely fill the back volume and is instead deposited to a level as shown in FIG. 16c. A layer 141 of silicon nitride dielectric is deposited onto the lower surface of the substrate and also into the back volume, onto the surface of the sacrificial material 145.

A further sacrificial layer 142 of e.g. polyimide is deposited on the layer 141 of silicon nitride and is patterned using a pattern mask layer as shown in FIG. 16d. Thus, as shown in FIG. 16d, the layers 107 and 109 exhibit a step-change in the region of the substrate cavity.

Figure 16E:
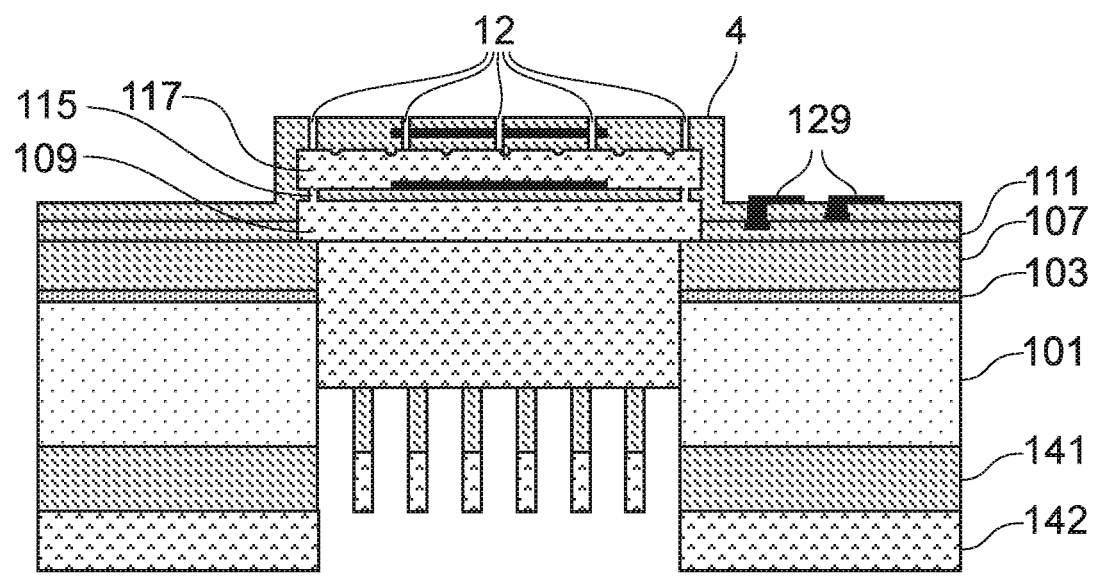

An etch is then performed from underneath the substrate, with the regions of the layer 141 that are beneath the patterned sacrificial layer being protected from the etching process, thus resulting in a patterned silicon nitride layer 141 as shown in FIG. 16e.

Figure 16F:
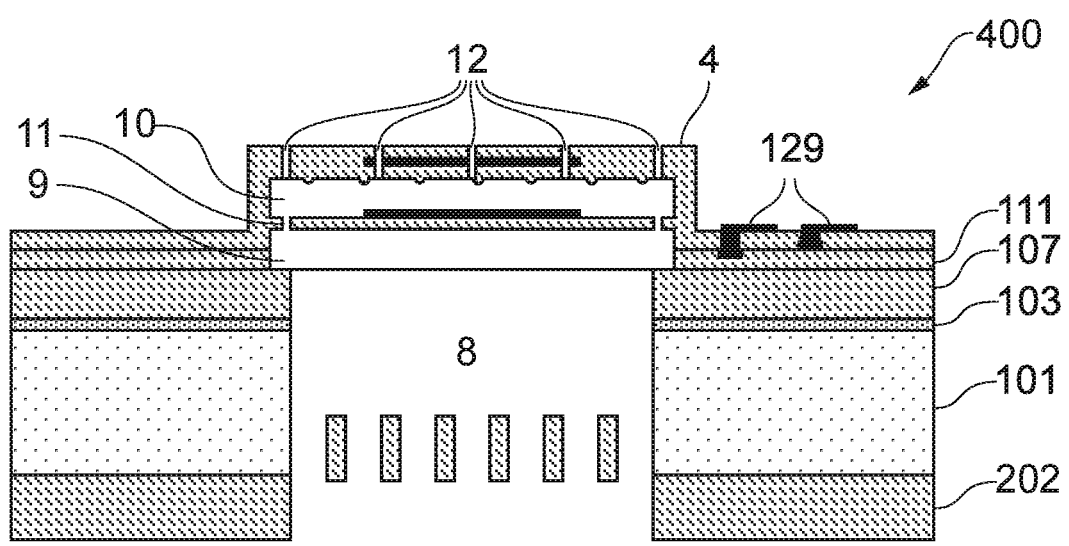

Finally, removal of all of the sacrificial layers takes place to produce the MEMS transducer as shown in FIG. 16f.

Thus, FIG. 16f illustrates a MEMS transducer 400 according to a third example embodiment having an integrated filter 202. In this example the filter is embedded or recessed within the cavity 8 of the substrate. This configuration may be beneficial during subsequent processing of the wafer. In particular, it is usual for the wafer to be placed on a dicing tape for singulation. During this process, the filter will be protected within the cavity of the MEMS transducer and is less likely to suffer from mechanical damage during the pick and place procedure.

One or more transducers according to any of the example embodiments described above may be incorporated in a package. FIGS. 17a to 17g illustrate various different packaging arrangements. FIGS. 17a to 17g each show one transducer element located in the package but it will be appreciated that in some embodiments there may be more one than transducer, e.g. a transducer array, and the various transducers may be formed on the same transducer substrate, i.e. a monolithic transducer substrate, or may be formed as separate transducers with separate transducer substrates each separate transducer substrate being bonded to a package substrate.

Figure 17A:
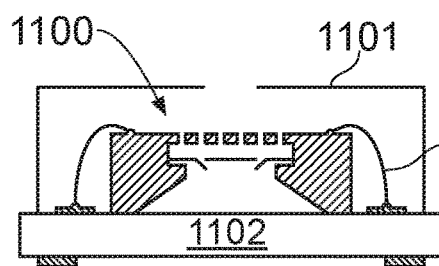

FIG. 17a shows a first arrangement where a transducer 1100 is located in a cover 1101, which forms at least part of a housing, on a package substrate 1102. The cover in this example could be a metallic housing which is bonded to the substrate. The package substrate may comprise at least one insulating layer. The package substrate may also comprise at least one conductive layer. The package substrate may be a semiconductor material or may be formed from a material such as PCB, ceramic or the like. Where the cover 1101 is metallic, or itself comprises a conductive layer, the cover may be electrically coupled to the conductive layer of the substrate, e.g. so that the housing provides shielding for electromagnetic interference (EMI). Bond wires 1103 may connect the transducer to bond pads on the package substrate. In some embodiments, read-out circuitry, for instance amplifier circuitry, may be located within the housing formed in or connected to the package substrate. Through-vias through the package substrate (not illustrated) may connect to contacts, i.e. solder pads, 1104 for electrically connecting external circuitry (not illustrated) to the package to allow transmission of electrical signals to/from the transducer 1100. In the example shown in FIG. 17a there is a sound port or acoustic port in the cover 1101 to allow sound to enter the package. According to convention, the configuration shown in FIG. 17a—in which the sound port is provided on opposite side of the package to the external electrical connection—is known as a "top port" configuration.

Figure 17B:
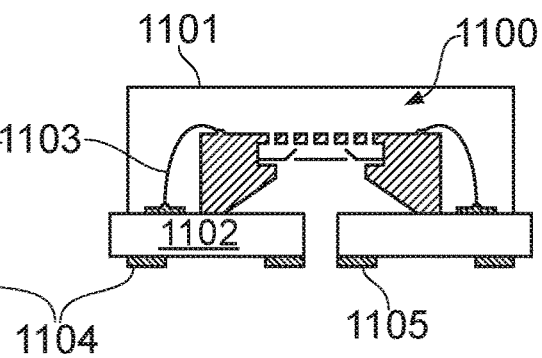

FIG. 17b illustrates an alternative arrangement where the sound port is provided in the package substrate 1102 and may, in use, be sealed. A ring 1105, which may be a sealing ring or a solder pad ring (for use in forming a solder ring) may be provided around the periphery of the sound port on the outer side of the package to allow, in use, sealing of a sound path leading to the sound port when the package is connected to another PCB for example. In this embodiment the transducer is arranged in a bottom port arrangement (i.e. the sound port is provided on the same side of the package to the external electrical connection) with the volume defined by the housing 1101 forming part of the back-volume of the transducer.

Figure 17C:
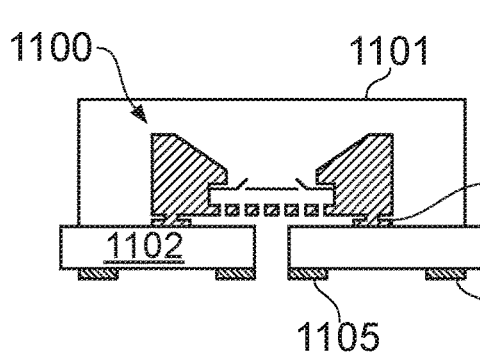

FIG. 17c illustrates an example where instead of bond wires connecting the transducer to the package substrate the transducer structure is inverted and flip-chip bonded to package substrate via connections 1106. In this example the sound port is in the package substrate such that the package is arranged in a bottom port arrangement.

Figure 17D:
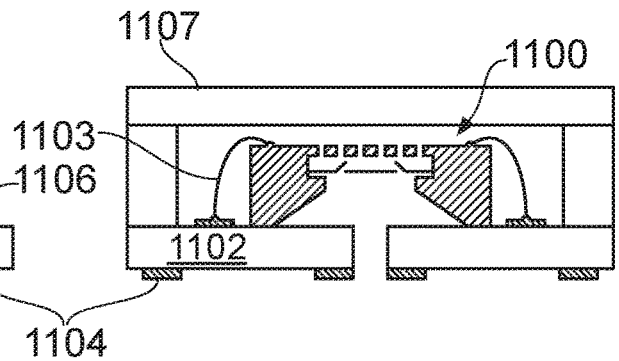
Figure 17E:
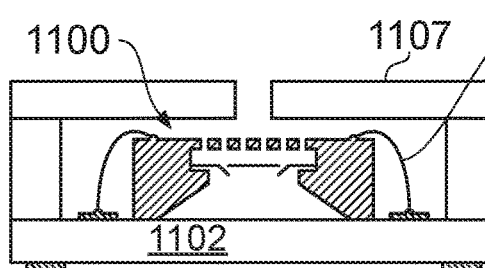
Figure 17F:
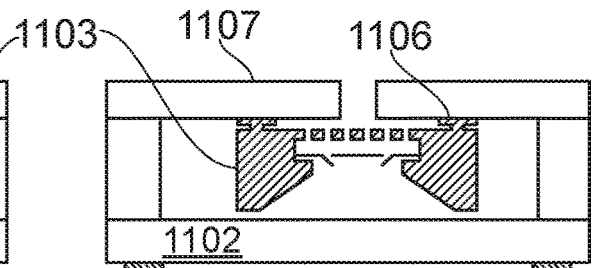
Figure 17G:
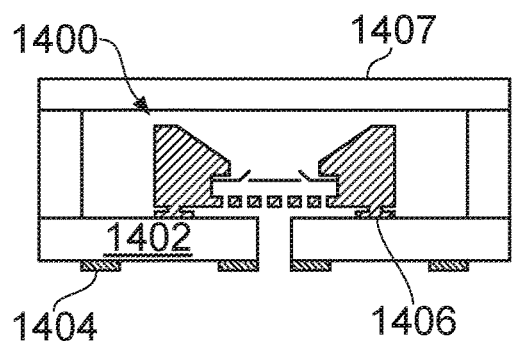

FIG. 17d illustrates an alternative example to that of FIG. 10b wherein a housing 1107 is formed from various panels of material, for example PCB or the like. In this instance the housing 1107 may comprise one or more conductive layers and/or one or more insulating layers. FIG. 17d shows the sound port in the package substrate. FIG. 17e shows an alternative arrangement to that of FIG. 17b wherein a housing 1107 is formed from various panels of material, for example PCB or the like as described in relation to FIG. 17d. FIG. 17f shows a further embodiment where the transducer structure is bonded via connections 1106 to the housing upper layer, which may for instance be PCB or layered conductive/insulating material. In this example however the electrical connections to the package are still via contacts, solder pads, 1104 on the package substrate, e.g. through-vias (not illustrated) in the package substrate with conductive traces on the inside of the housing to the transducer. FIG. 17g illustrates an alternative example to that of FIG. 17c wherein a transducer is flip-chip bonded to the package substrate in a housing 1107 formed from panels of material, for example PCB or the like as described in relation to FIG. 17d.

Figure 17H:
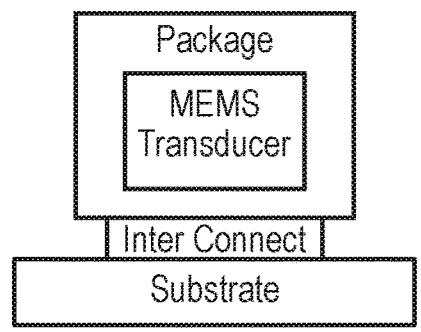

In general, as illustrated in FIG. 17h, one or more transducers may be located in a package, the package is then operatively interconnected to another substrate, such as a mother-board, as known in the art.

The flexible membrane layer of a MEMS transducer generally comprises a thin layer of a dielectric material—such as a layer of crystalline or polycrystalline material. The membrane layer may, in practice, be formed by several layers of material which are deposited in successive steps. The flexible membrane may, for example, be formed from silicon nitride $Si_3N_4$ or polysilicon. Crystalline and polycrystalline materials have high strength and low plastic deformation, both of which are highly desirable in the construction of a membrane. The membrane electrode of a MEMS transducer is typically a thin layer of metal, e.g. aluminium, which is typically located in the centre of the membrane, i.e. that part of the membrane which displaces the most. It will be appreciated by those skilled in the art that the membrane electrode may be formed by an alloy such as aluminium-silicon for example. The membrane electrode may typically cover, for example, around 40% of area of the membrane, usually in the central region of the membrane. Thus, known transducer membrane structures are composed of two layers of different material—typically a dielectric layer (e.g. SiN) and a conductive layer (e.g. AlSi).

In some applications the backplate may be arranged in the front volume, so that incident sound reaches the membrane via the acoustic holes in the backplate. In such a case the substrate cavity may be sized to provide at least a significant part of a suitable back-volume. In other applications, the microphone may be arranged so that sound may be received via the substrate cavity 108 in use, i.e. the substrate cavity forms part of an acoustic channel to the membrane and part of the front volume. In such applications the backplate 4 forms part of the back-volume which is typically enclosed by some other structure, such as a suitable package.

It should also be noted that whilst the illustrated examples show the backplate being supported on the opposite side of the membrane to the substrate, arrangements are known where the backplate is formed closest to the substrate with the membrane layer supported above it.

In order to process an electrical output signal from the microphone, the die/device may have circuit regions (not shown) that are integrally fabricated using standard CMOS processes on the substrate 1. The circuit regions may comprise conducting (for example aluminium or copper) circuit interconnects that are used to electrically connect to the microphone via interconnect points to the circuit region.

The circuit regions may be fabricated in the CMOS silicon substrate using standard processing techniques such as ion implantation, photomasking, metal deposition and etching. The circuit regions may comprise any circuit operable to interface with a MEMS microphone and process associated signals. For example, one circuit region may be a pre-amplifier connected so as to amplify an output signal from the microphone. In addition another circuit region may be a charge-pump that is used to generate a bias, for example 10 volts, across the two electrodes. This has the effect that changes in the electrode separation (i.e. the capacitive plates of the microphone) change the MEMS microphone capacitance; assuming constant charge, the voltage across the electrodes is correspondingly changed. A pre-amplifier, preferably having high impedance, is used to detect such a change in voltage.

The circuit regions may optionally comprise an analogue-to-digital converter (ADC) to convert the output signal of the microphone or an output signal of the pre-amplifier into a corresponding digital signal, and optionally a digital signal processor to process or part-process such a digital signal. Furthermore, the circuit regions may also comprise a digital-to-analogue converter (DAC) and/or a transmitter/receiver suitable for wireless communication. However, it will be appreciated by one skilled in the art that many other circuit arrangements operable to interface with a MEMS transducer signal and/or associated signals, may be envisaged.

It will also be appreciated that, alternatively, the microphone device may be a hybrid device (for example whereby the electronic circuitry is totally located on a separate integrated circuit, or whereby the electronic circuitry is partly located on the same device as the microphone and partly located on a separate integrated circuit) or a monolithic device (for example whereby the electronic circuitry is fully integrated within the same integrated circuit as the microphone).

Although the various embodiments describe a MEMS capacitive microphone, the invention is also applicable to any form of MEMS transducers other than microphones, for example pressure sensors or ultrasonic transmitters/receivers.

Examples described herein may be usefully implemented in a range of different material systems, however the examples described herein are particularly advantageous for MEMS transducers having membrane layers comprising silicon nitride.

It is noted that the example embodiments described above may be used in a range of devices, including, but not limited to: analogue microphones, digital microphones, pressure sensors or ultrasonic transducers. The example embodiments may also be used in a number of applications, including, but not limited to, consumer applications, medical applications, industrial applications and automotive applications. For example, typical consumer applications include portable audio players, laptops, mobile phones, PDAs and personal computers. Example embodiments may also be used in voice activated or voice controlled devices. Typical medical applications include hearing aids. Typical industrial applications include active noise cancellation. Typical automotive applications include hands-free sets, acoustic crash sensors and active noise cancellation.

Features of any given aspect or example embodiment may be combined with the features of any other aspect or example embodiment and the various features described herein may be implemented in any combination in a given embodiment.

Associated methods of fabricating a MEMS transducer are provided for each of the example embodiments.

It should be understood that the various relative terms above, below, upper, lower, top, bottom, underside, overlying, underlying, beneath, etc. that are used in the present description should not be in any way construed as limiting to any particular orientation of the transducer during any fabrication step and/or its orientation in any package, or indeed the orientation of the package in any apparatus. Thus the relative terms shall be construed accordingly.

It should be understood that reference to the transducer and/or integrated circuit being "mounted on" the first member should be interpreted as requiring that the transducer and/integrated circuit are directly mounted on the first member, but should encompass examples in which the transducer and/or integrated circuit are indirectly mounted on the first member. Thus, one or more other layers may be provided between the first member and the transducer and/or integrated circuit.

In the examples described above it is noted that references to a transducer may comprise various forms of transducer element. For example, a transducer may be typically mounted on a die and may comprise a single membrane and back-plate combination. In another example a transducer die comprises a plurality of individual transducers, for example multiple membrane/back-plate combinations. The individual transducers of a transducer element may be similar, or configured differently such that they respond to acoustic signals differently, e.g. the elements may have different sensitivities. A transducer element may also comprise different individual transducers positioned to receive acoustic signals from different acoustic channels.

It is noted that in the examples described herein a transducer element may comprise, for example, a microphone device comprising one or more membranes with electrodes for read-out/drive deposited on the membranes and/or a substrate or back-plate. In the case of MEMS pressure sensors and microphones, the electrical output signal may be obtained by measuring a signal related to the capacitance between the electrodes.

The examples are also intended to embrace a transducer element being a capacitive output transducer, wherein a membrane is moved by electrostatic forces generated by varying a potential difference applied across the electrodes, including examples of output transducers where piezo-electric elements are manufactured using MEMS techniques and stimulated to cause motion in flexible members.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference signs in the claims shall not be construed so as to limit their scope.

The invention claimed is:

1. A MEMS transducer comprising:
   a substrate having a cavity which extends through the substrate;
   a membrane which overlies the cavity;

a backplate; and a filter configured and arranged to inhibit the entry of particles into at least a region of the interior of the substrate cavity from a region underlying the substrate; wherein the filter is formed from the material that forms one or more of a dielectric layer and an oxidation layer of the MEMS transducer.

2. A MEMS transducer comprising:

a substrate having a cavity which extends through the substrate from a first opening in a first side of the substrate to a second opening in a second side of the substrate;

a backplate;

a membrane which is supported relative to the second side of substrate and overlies the cavity;

an integrated filter provided within the substrate cavity or at/across the first opening of the substrate cavity; wherein the integrated filter is formed from the material that forms one or more of a dielectric layer and an oxidation layer of the MEMS transducer.

3. A MEMS transducer comprising a backplate and a flexible membrane supported relative to a substrate cavity, the transducer having an integrated filter for providing environmental protection to at least a region of the substrate cavity; wherein the integrated filter is formed from the material that forms one or more of a dielectric layer and an oxidation layer of the MEMS transducer.

4. The MEMS transducer as claimed in claim 1, wherein the filter comprises a barrier for substantially inhibiting the flow of particles through the filter to a region upstream of the filter.

5. The MEMS transducer as claimed in claim 1, wherein the filter comprises a plurality of holes which extend through the filter, the plurality of holes being configured to substantially allow the transmission of acoustic sound waves through the filter.

6. The MEMS transducer as claimed in claim 1, wherein the filter comprises at least one surface which is hydrophobic.

7. The MEMS transducer as claimed in claim 6 wherein the underside of the filter is provided with a hydrophobic coating.

8. The MEMS transducer as claimed in claim 1, wherein the filter is provided at, or near, the bottom of the substrate.

9. The MEMS transducer as claimed in claim 1, wherein said filter is formed from the material that forms a conductive layer of the MEMS transducer.

10. The MEMS transducer as claimed in claim 1, wherein said filter is formed from silicon nitride.

11. The MEMS transducer as claimed in claim 1, wherein the filter is recessed or embedded within the substrate cavity.

12. The MEMS transducer as claimed in claim 1, wherein the filter is provided by a layer formed during the fabrication of the MEMS transducer.

13. The MEMS transducer as claimed in claim 1, wherein the membrane layer is supported relative to the substrate of the transducer so as to define a flexible membrane of the transducer.

14. The MEMS transducer as claimed in claim 1, comprising a back-plate structure wherein the membrane is supported with respect to said back-plate structure.

15. The MEMS transducer as claimed in claim 14 wherein said back-plate structure comprises a plurality of holes through the back-plate structure.

16. The MEMS transducer as claimed in claim 1, wherein said transducer comprises a capacitive sensor.

17. The MEMS transducer as claimed in claim 1, wherein said transducer comprises a microphone.

18. The MEMS transducer as claimed in claim 16 further comprising readout circuitry.

19. An electronic device comprising a MEMS transducer as claimed in claim 1, wherein said device is at least one of: a portable device; a battery powered device; an audio device; a computing device; a communications device; a personal media player;

a mobile telephone; a games device; and a voice controlled device.

20. A MEMS transducer comprising:

a substrate having a cavity which extends through the substrate;

a membrane which overlies the cavity;

a backplate; and an integrated filter configured and arranged to inhibit the entry of particles into at least a region of the interior of the substrate cavity from a region underlying the substrate; wherein the integrated filter is formed from the material that forms one or more of a dielectric layer and an oxidation layer of the MEMS transducer.

21. A MEMS transducer comprising:

a substrate having a cavity which extends through the substrate;

a membrane which overlies the cavity;

a structural layer comprising a plurality of acoustic holes arranged to allow free movement of air through the structural layer; and an integrated filter configured and arranged to inhibit the entry of particles into at least a region of the interior of the substrate cavity from a region underlying the substrate; wherein the membrane is arranged between the structural layer and the integrated filter; and wherein the integrated filter is formed from the material that forms one or more of a dielectric layer and an oxidation layer of the MEMS transducer.

* * * * *